United States Patent
Li et al.

(10) Patent No.: US 12,019,919 B2
(45) Date of Patent: *Jun. 25, 2024

(54) CACHE PROGRAM OPERATION OF THREE-DIMENSIONAL MEMORY DEVICE WITH STATIC RANDOM-ACCESS MEMORY

(71) Applicant: YANGTZE MEMORY TECHNOLOGIES CO., LTD., Wuhan (CN)

(72) Inventors: Yue Ping Li, Wuhan (CN); Chun Yuan Hou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 17 days.

This patent is subject to a terminal disclaimer.

(21) Appl. No.: 17/939,333

(22) Filed: Sep. 7, 2022

(65) Prior Publication Data

US 2022/0413771 A1 Dec. 29, 2022

Related U.S. Application Data

(63) Continuation of application No. 16/455,643, filed on Jun. 27, 2019, now Pat. No. 11,474,739, which is a (Continued)

(51) Int. Cl.
*G06F 3/06* (2006.01)
*G06F 12/0868* (2016.01)
(Continued)

(52) U.S. Cl.
CPC .......... *G06F 3/0659* (2013.01); *G06F 3/0604* (2013.01); *G06F 3/068* (2013.01);
(Continued)

(58) Field of Classification Search
CPC ...... G06F 3/0659; G06F 3/068; G06F 3/0604; G06F 2212/1032; G06F 2212/281; G06F 12/0868
See application file for complete search history.

(56) References Cited

U.S. PATENT DOCUMENTS 5,663,905 A 9/1997 Matsuo et al.
6,292,426 B1 9/2001 Ikeda et al.
(Continued)

FOREIGN PATENT DOCUMENTS

CN 101246738 A 8/2008
CN 103383861 A 11/2013
(Continued)

OTHER PUBLICATIONS

International Search Report issued in corresponding International Application No. PCT/2019/087394, dated Jan. 23, 2020, 4 pages.
(Continued)

*Primary Examiner* — Ryan Bertram
(74) *Attorney, Agent, or Firm* — BAYES PLLC

(57) ABSTRACT

A three-dimensional (3D) memory device includes a 3D NAND memory array, an on-die static random-access memory (SRAM), and peripheral circuits formed on the same chip with the on-die SRAM. The peripheral circuits include a page buffer coupled to the on-die SRAM and a controller coupled to the on-die SRAM and the page buffer. The controller may be configured to load program data into the page buffer and cache the program data into the on-die SRAM as a backup copy of the program data. In response to a status of programming the program data from the page buffer into the 3D NAND memory array being failed, the controller may be further configured to transmit the backup copy of the program data in the on-die SRAM to the page
(Continued)

buffer, and program the backup copy of the program data in the page buffer into the 3D NAND memory array.

20 Claims, 16 Drawing Sheets

Related U.S. Application Data continuation of application No. PCT/CN2019/087394, filed on May 17, 2019.

(51) Int. Cl.

| | | |
|---|---|---|
| *G11C 14/00* | (2006.01) | |
| *G11C 16/04* | (2006.01) | |
| *G11C 16/10* | (2006.01) | |
| *H01L 23/00* | (2006.01) | |
| *H01L 25/00* | (2006.01) | |
| *H01L 25/18* | (2023.01) | |
| *H10B 10/00* | (2023.01) | |
| *H10B 41/27* | (2023.01) | |
| *H10B 43/27* | (2023.01) | |
| *G11C 11/56* | (2006.01) | |
| *H10B 41/40* | (2023.01) | |
| *H10B 43/40* | (2023.01) | |

(52) U.S. Cl.
CPC ...... *G06F 12/0868* (2013.01); *G11C 14/0063* (2013.01); *G11C 16/0483* (2013.01); *G11C 16/10* (2013.01); *H01L 24/05* (2013.01); *H01L 24/32* (2013.01); *H01L 25/18* (2013.01); *H01L 25/50* (2013.01); *H10B 10/12* (2023.02); *H10B 41/27* (2023.02); *H10B 43/27* (2023.02); *G06F 2212/1032* (2013.01); *G06F 2212/281* (2013.01); *G11C 11/5621* (2013.01); *G11C 11/5671* (2013.01); *H01L 2224/32145* (2013.01); *H10B 41/40* (2023.02); *H10B 43/40* (2023.02)

(56) References Cited

U.S. PATENT DOCUMENTS

| | | | |
|---|---|---|---|
| 6,661,732 B2 | 12/2003 | Sunaga | |
| 6,954,377 B2 | 10/2005 | Choi et al. | |
| 7,177,187 B2 | 2/2007 | Ishii | |
| 7,280,397 B2 | 10/2007 | Scheuerlein | |
| 7,882,299 B2 | 2/2011 | Conley et al. | |
| 9,606,730 B2 | 3/2017 | Jun et al. | |
| 10,811,071 B1 | 10/2020 | Li et al. | |
| 2005/0128808 A1 | 6/2005 | Sakui | |
| 2005/0185493 A1 | 8/2005 | Fujioka et al. | |
| 2008/0162789 A1* | 7/2008 | Choi | G11C 16/102 711/104 |
| 2009/0129186 A1 | 5/2009 | Schnell et al. | |
| 2011/0176377 A1 | 7/2011 | Koyama | |
| 2011/0233681 A1 | 9/2011 | Matsuo | |
| 2012/0203959 A1 | 8/2012 | Yoon et al. | |
| 2012/0267689 A1 | 10/2012 | Chen et al. | |
| 2013/0083589 A1 | 4/2013 | Or-Bach et al. | |
| 2014/0334232 A1 | 11/2014 | Nam et al. | |
| 2015/0039809 A1 | 2/2015 | Kim et al. | |
| 2015/0055406 A1 | 2/2015 | Andre | |
| 2015/0078066 A1 | 3/2015 | Takemura | |
| 2015/0193301 A1 | 7/2015 | Sukegawa et al. | |
| 2015/0255158 A1 | 9/2015 | Fujita et al. | |
| 2015/0261448 A1 | 9/2015 | Kojima et al. | |
| 2015/0301941 A1 | 10/2015 | Jun et al. | |
| 2015/0325285 A1 | 11/2015 | Tsutsui | |
| 2015/0340366 A1 | 11/2015 | Lim et al. | |
| 2016/0071591 A1 | 3/2016 | Hsu | |
| 2016/0092129 A1 | 3/2016 | Agarwal et al. | |
| 2016/0253099 A1 | 9/2016 | Jun et al. | |
| 2017/0084348 A1 | 3/2017 | Zhang | |
| 2018/0190210 A1 | 7/2018 | Chung | |
| 2018/0342455 A1 | 11/2018 | Nosho et al. | |
| 2018/0373313 A1 | 12/2018 | Hasbun | |
| 2019/0043836 A1 | 2/2019 | Fastow et al. | |
| 2019/0065095 A1 | 2/2019 | Srinivasan et al. | |
| 2019/0081069 A1 | 3/2019 | Lu et al. | |
| 2019/0087128 A1 | 3/2019 | Shin | |
| 2019/0088589 A1 | 3/2019 | Zhu et al. | |
| 2019/0102296 A1* | 4/2019 | Natarajan | G06F 12/0895 |
| 2019/0114239 A1 | 4/2019 | Seo | |
| 2019/0138220 A1 | 5/2019 | Hahn et al. | |
| 2019/0180830 A1 | 6/2019 | Natarajan et al. | |
| 2019/0237461 A1 | 8/2019 | Or-Bach et al. | |
| 2020/0319799 A1 | 10/2020 | Mayer et al. | |
| 2020/0363983 A1 | 11/2020 | Li et al. | |
| 2020/0363989 A1 | 11/2020 | Li et al. | |
| 2021/0118853 A1 | 4/2021 | Harris et al. | |

FOREIGN PATENT DOCUMENTS

| | | |
|---|---|---|
| CN | 104424134 A | 3/2015 |
| CN | 105097019 A | 11/2015 |
| CN | 107658315 A | 2/2018 |
| CN | 108475235 A | 8/2018 |
| CN | 109219885 A | 1/2019 |
| CN | 109524044 A | 3/2019 |
| CN | 109671712 A | 4/2019 |
| JP | 2013513903 A | 4/2013 |
| JP | 2016174037 A | 9/2016 |
| TW | 201624488 A | 7/2016 |
| TW | 201626388 A | 7/2016 |
| TW | 201834244 A | 9/2018 |
| TW | 201841160 A | 11/2018 |
| TW | 201906129 A | 2/2019 |

OTHER PUBLICATIONS

Written Opinion of the International Searching Authority issued in corresponding International Application No. PCT/2019/087394, dated Jan. 23, 2020, 4 pages.

International Search Report issued in corresponding International Application No. PCT/2019/087399, dated Feb. 18, 2020, 4 pages.

Written Opinion of the International Searching Authority issued in corresponding International Application No. PCT/2019/087399, dated Feb. 18, 2020, 4 pages.

Luo, Yixin; "Architectural Techniques for Improving NANO Flash Memory Reliability;" Mar. 2018; School of Computer Science Carnegie Mellon University; at least pp. 13-24, 26-32 and 77-81; available at: http://reports-archive.adm.cs.cmu.edu/anon/2018/ CMU-CS-18-101.pdf (Year: 2018).

Derhacobian, Narbeh; "One chip to rule them all? The internet of things and the next great era of hardware;" May 28, 2016; TechCrunch; available at: https://techcrunch.com/2016/05/28/.

Lexinnova; "3D Stacked Memory: Patent Landscape Analysis", Lexinnova; 2015; available at: https://www.wipo.int/edocs/pirdocs/en/ledxinnova_plr_3d_stacked_memory.pdf (Year: 2015).

Loh, Gabriel; "3D-Stacked Memory Architectures for Multi-Core Processors;" IEEE.com; Jul. 15, 2008; available at: https://ieeexpl.ore.ieee.org/document/4556747 (Year: 2008).

Extended European Search Report issued in corresponding European Application No. 1992844.9, dated Jul. 18, 2022, 8 pages.

Extended European Search Report issued in corresponding European Application No. 19929880.3, dated Aug. 8, 2022, 7 pages.

* cited by examiner

200

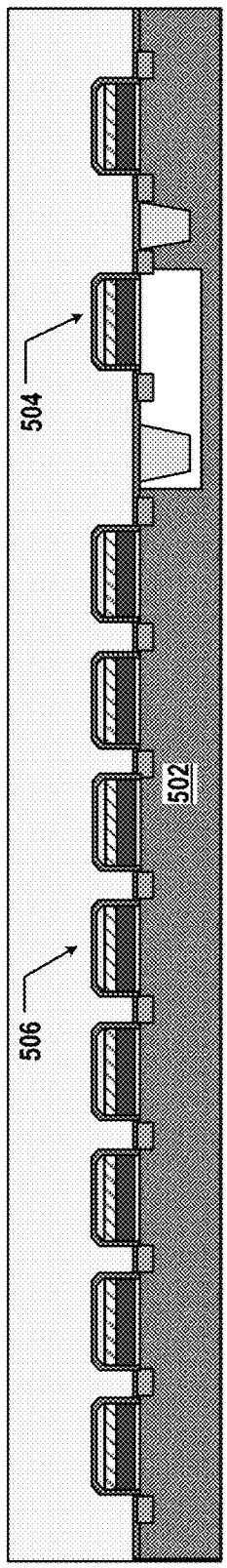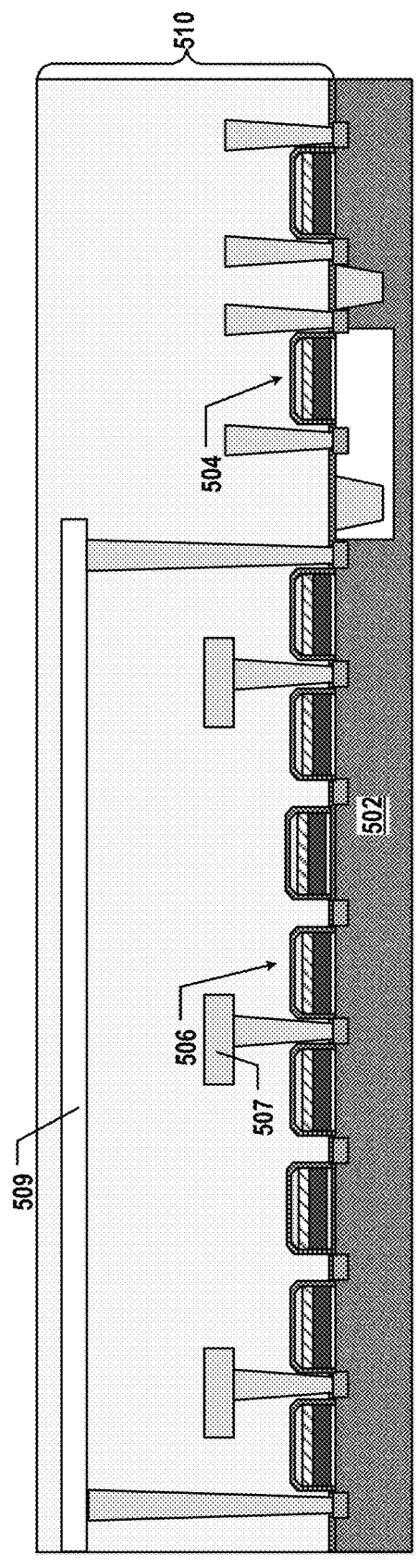
FIG. 5A
FIG. 5B

CACHE PROGRAM OPERATION OF THREE-DIMENSIONAL MEMORY DEVICE WITH STATIC RANDOM-ACCESS MEMORY

CROSS REFERENCE TO RELATED APPLICATION

This application is a continuation of U.S. application Ser. No. 16/455,643, filed on Jun. 27, 2019, which is a continuation of International Application No. PCT/CN2019/087394, filed on May 17, 2019, entitled "CACHE PROGRAM OPERATION OF THREE-DIMENSIONAL MEMORY DEVICE WITH STATIC RANDOM-ACCESS MEMORY," the contents of which are hereby incorporated by reference in their entireties. This application is also related to U.S. application Ser. No. 16/455,656, filed on Jun. 27, 2019, entitled "THREE-DIMENSIONAL MEMORY DEVICE WITH STATIC RANDOM-ACCESS MEMORY," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices with a static random-access memory (SRAM) and operation methods thereof are disclosed herein.

In one example, a 3D memory device includes a 3D NAND memory array having a plurality of pages, an on-die cache coupled to the memory array on a same chip and configured to cache a plurality of batches of program data between a host and the memory array, the on-die cache having SRAM cells, and a controller coupled to the on-die cache on the same chip. The controller is configured to check a status of an $(N-2)^{th}$ batch of program data, N being an integer equal to or greater than 2, program an $(N-1)^{th}$ batch of program data into respective pages in the 3D NAND memory array, and cache an $N^{th}$ batch of program data in respective space in the on-die cache as a backup copy of the $N^{th}$ batch of program data.

In another example, a system for performing a cache program operation on a 3D memory device includes a host, a storage unit having a plurality of pages of NAND memory cells and being coupled to the host, a caching unit coupled to and on a same chip with the storage unit, the caching unit configured to cache a plurality of batches of program data between the host and the storage unit, and a control unit coupled to the caching unit and the host. The control unit is configured to check a status of an $(N-2)^{th}$ batch of program data that was programmed into the storage unit from the host. N is an integer equal to or greater than 2. The control unit is also configured to program an $(N-1)^{th}$ batch of program data into respective pages of the storage unit and cache an $N^{th}$ batch of program data in respective space in the caching unit as a backup copy of the $N^{th}$ batch of program data.

In still another example, a method for performing a cache program operation on a 3D memory device includes checking a status of an $(N-2)^{th}$ batch of program data that was programmed into the storage unit from the host. N is an integer equal to or greater than 2. The method may also include programming an $(N-1)^{th}$ batch of program data into respective pages in the 3D NAND memory array and caching an $N^{th}$ batch of program data in respective space in on-die static random-access memory (SRAM) cells as a backup copy of the $N^{th}$ batch of program data.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 5A-5C illustrate a fabrication process for forming an exemplary semiconductor structure having a peripheral circuit and an SRAM, according to some embodiments.

Figure 1A:
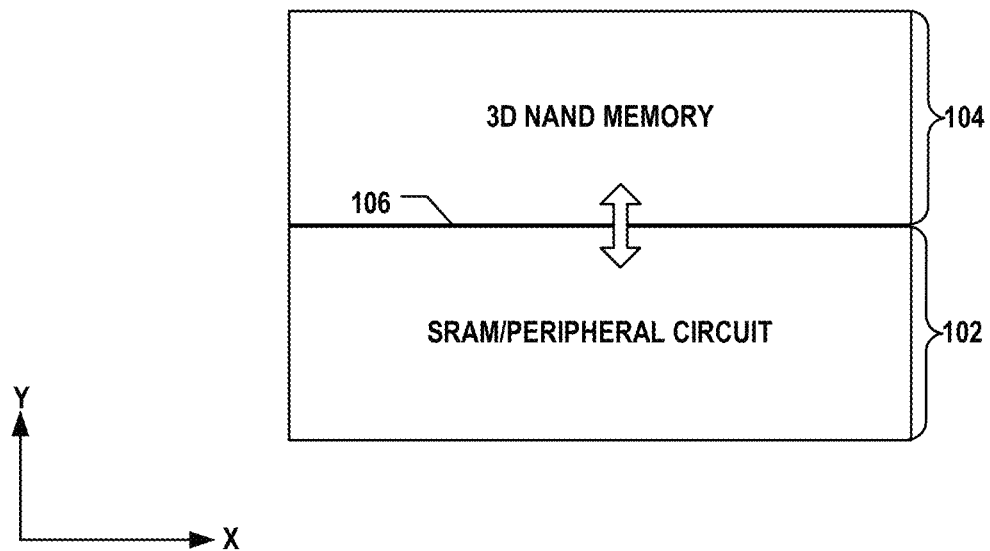
FIG. 1A illustrates a schematic view of a cross-section of an exemplary 3D memory device with an SRAM, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In conventional 3D memory devices, the periphery circuits that are formed outside of memory array devices on the same plane can occupy a large area of the device chip, thereby leading to poor array efficiency, large die size, and high cost. Also, the thermal budget associated with processing the memory array device limits the peripheral circuit performance requirement, making it difficult to achieve high input/output (I/O) speed of the 3D memory device. Moreover, in memory technology, operations based on caching and/or buffering program data often require additional memory space. The conventional 3D memory architecture makes it difficult for certain operations that requires additional memory space to be implemented.

For example, cache program operations are commonly used in a solid-state drive of a memory device to improve the performance (e.g., speed) of sequential programming. In a cache program operation, program data are sequentially written into memory cells while cached/buffered into a cache to allow faster programming. Due to considerations such as volume and cost, cache spaces are often not formed in memory packages such as an embedded multi-media card (eMMC) or universal flash storage (UFS). Cache program operations are often not enabled in such memory packages. As a result, high-speed sequential programming in these memory packages can be limited. In another example, a memory device can use a considerable amount of resources (e.g., data buffers and data buses) to buffer and transmit program data. This can slow down other operations (e.g., buffering and/or transmitting data for other operations). The overall performance of the memory device can be limited.

Various embodiments in accordance with the present disclosure provide a 3D memory device having an on-chip static random-access memory (SRAM) with improved I/O speed, throughput, and memory density. On-die SRAM cells are formed on the same chip with peripheral circuits of the 3D memory device. The SRAM cells can locate in the area that is not occupied by the peripheral circuits (e.g., the spare space neighboring peripheral circuits) and thus, do not need extra space to be formed. The on-die SRAM can enable high-speed read and write operations on the memory cells of the 3D memory device. In an embodiment, the on-die SRAM is used as a cache for a cache program operation. In another embodiment, the on-die SRAM is used as a data buffer for coarse and fine programming of the memory cells, releasing buffering space in the main buffer of the system. The on-die SRAM can thus enable high-speed sequential programming in the 3D memory device and allow more space to be released in the main buffer for other operations.

FIG. 1A illustrates a schematic view of a cross-section of an exemplary 3D memory device 100 with an SRAM, according to some embodiments. 3D memory device 100 represents an example of a non-monolithic 3D memory device. The term "non-monolithic" means that the components of 3D memory device 100 (e.g., peripheral circuit/SRAM and 3D NAND memory) can be formed separately on different substrates and then joined to form a 3D memory device. 3D memory device 100 can include a first semiconductor structure 102 including peripheral circuits and an array of SRAM cells. Both peripheral circuits and the SRAM cell array can be implemented with advanced logic processes (e.g., technology nodes of 90 nm, 80 nm, 65 nm, 55 nm, 45 nm, 40 nm, 32 nm, 28 nm, 22 nm, 20 nm, 16 nm, 14 nm, 10 nm, 7 nm, 5 nm, 3 nm, etc.) to achieve high speed. In some embodiments, the peripheral circuits and SRAM cell array in first semiconductor structure 102 use complementary metal-oxide-semiconductor (CMOS) technology.

In some embodiments, the peripheral circuits include any suitable digital, analog, and/or mixed-signal peripheral circuits used for facilitating the operation of 3D memory device 100. For example, the peripheral circuits can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). An SRAM is integrated on the same die of logic circuits (e.g., the peripheral circuits), allowing wider bus and higher operation speed. The memory controller of the SRAM can be embedded as part of the peripheral circuits. In some embodiments, each SRAM cell includes a plurality of transistors for string a bit of data as a positive of negative electrical charge as well as one or more transistors that control access to it. In one example, each SRAM cell has six transistors (e.g., metal-oxide-semiconductor field-effect transistors (MOSFETs)), for example, four transistors for storing a bit of data and two transistors for controlling access to the data.

3D memory device 100 can also include a second semiconductor structure 104 including an array of 3D NAND memory strings. That is, second semiconductor structure 104 can be a NAND Flash memory device in which memory cells are provided in the form of an array of NAND memory strings. In some embodiments, depending on the NAND technology (e.g., the number of levels/tiers in the memory stack), a 3D NAND memory string typically consists of 32 to 256 NAND memory cells. 3D NAND memory strings can be organized into pages which are then organized into blocks in which each 3D NAND memory string is connected to a separate line called a bit line (BL). All cells with the same position in the 3D NAND memory string can be connected through the control gates by a word line (WL). In some embodiments, a plane contains a certain number of blocks that are connected through the same bit line. Second semiconductor structure 104 can include one or more planes, and the peripheral circuits that are needed to perform all the read/write/erase operations can be included in first semiconductor structure 102.

As shown in FIG. 1A, 3D memory device 100 further includes a bonding interface 106 vertically between first semiconductor structure 102 and second semiconductor structure 104. As described below in detail, first and second semiconductor structures 102 and 104 can be fabricated separately (and in parallel in some embodiments) such that the thermal budget of fabricating one of first and second semiconductor structures 102 and 104 does not limit the processes of fabricating another one of first and second semiconductor structures 102 and 104. Moreover, a large number of interconnects (e.g., bonding contacts via hybrid bonding) can be formed through bonding interface 106 to make direct, short electrical connections between first semiconductor structure 102 and second semiconductor structure 104, as opposed to the long-distance chip-to-chip data bus on the circuit board, thereby eliminating chip interface delay and achieving high-speed I/O throughput with reduced power consumption. Data transfer between the array of 3D NAND memory strings in second semiconductor structure 104 and the array of SRAM cells in first semiconductor structure 102 can be performed through the interconnects (e.g., bonding contacts via hybrid bonding) across bonding interface 106. Furthermore, by vertically integrating first and second semiconductor structures 102 and 104, the chip size can be reduced, and the memory cell density can be increased.

Figure 1B:
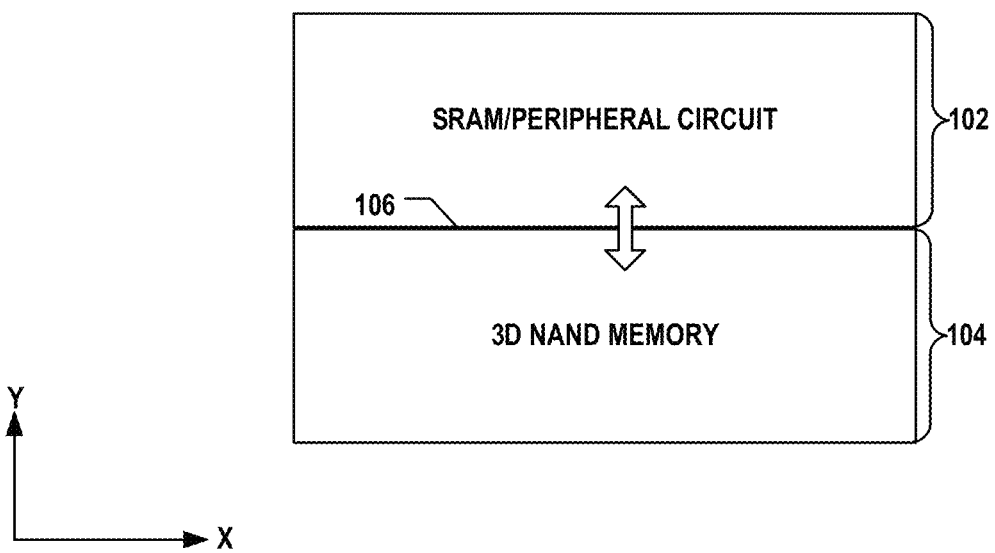
FIG. 1B illustrates a schematic view of a cross-section of another exemplary 3D memory device with an SRAM, according to some embodiments.

It is understood that the relative positions of stacked first and second semiconductor structures 102 and 104 are not limited. FIG. 1B illustrates a schematic view of a cross-section of another exemplary 3D memory device 101 with an SRAM, according to some embodiments. Different from 3D memory device 100 in FIG. 1A in which second semiconductor structure 104 including the array of 3D NAND memory strings is above first semiconductor structure 102 including the peripheral circuits and the array of SRAM cells, in 3D memory device 100 in FIG. 1B, first semiconductor structure 102 including the peripheral circuits and the array of SRAM cells is above second semiconductor structure 104 including the array of 3D NAND memory strings. Nevertheless, bonding interface 106 is formed vertically between first and second semiconductor structures 102 and 104 in 3D memory device 101 as well as first and second semiconductor structures 102 and 104 are joined vertically through bonding (e.g., hybrid bonding) according to some embodiments. Data transfer between the array of 3D NAND memory strings in second semiconductor structure 104 and the array of SRAM cells in first semiconductor structure 102 can be performed through the interconnects (e.g., bonding contacts via hybrid bonding) across bonding interface 106.

Figure 2:
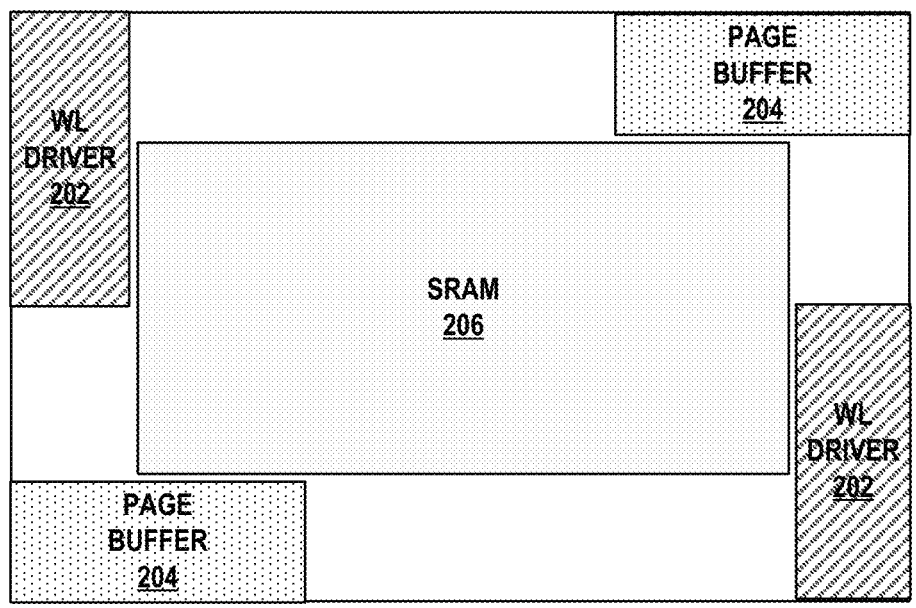
FIG. 2 illustrates a schematic plan view of an exemplary semiconductor structure having a peripheral circuit and an SRAM, according to some embodiments.

FIG. 2 illustrates a schematic plan view of an exemplary semiconductor structure 200 having a peripheral circuit and an SRAM, according to some embodiments. Semiconductor structure 200 may be one example of first semiconductor structure 102. Semiconductor structure 200 can include peripheral circuits for controlling and sensing a 3D NAND memory, including word line drivers 202, page buffers 204, and any other suitable circuits. Semiconductor structure 200 can further include SRAM 206 on the same die as the peripheral circuits and fabricated using the same logic process as the peripheral circuits. FIG. 2 shows an exemplary layout of the peripheral circuits (e.g., word line drivers 202, page buffers 204) and SRAM 206 in which peripheral circuits (e.g., word line drivers 202, page buffers 204) and SRAM 206 are formed in different regions on the same plane. For example, SRAM 206 may be formed outside of the peripheral circuits (e.g., word line drivers 202, page buffers 204). It is understood that the layout of semiconductor structure 200 is not limited to the exemplary layout in FIG. 2. In some embodiments, the peripheral circuit (e.g., word line drivers 202 and page buffers 204) and SRAM 206 are formed in non-overlapping regions of the same plane. In some embodiments, on a plane, SRAM 206 is formed in space that is not used for the formation of the peripheral circuit. In some embodiments, the peripheral circuit (e.g., word line drivers 202 and page buffers 204) and SRAM 206 (e.g., the array of SRAM cells) are stacked one over another, i.e., on different planes. For example, SRAM 206 (e.g., the array of SRAM cells) may be formed above or below the peripheral circuit (e.g., word line drivers 202, page buffers 204) to further reduce the chip size.

Figure 3:
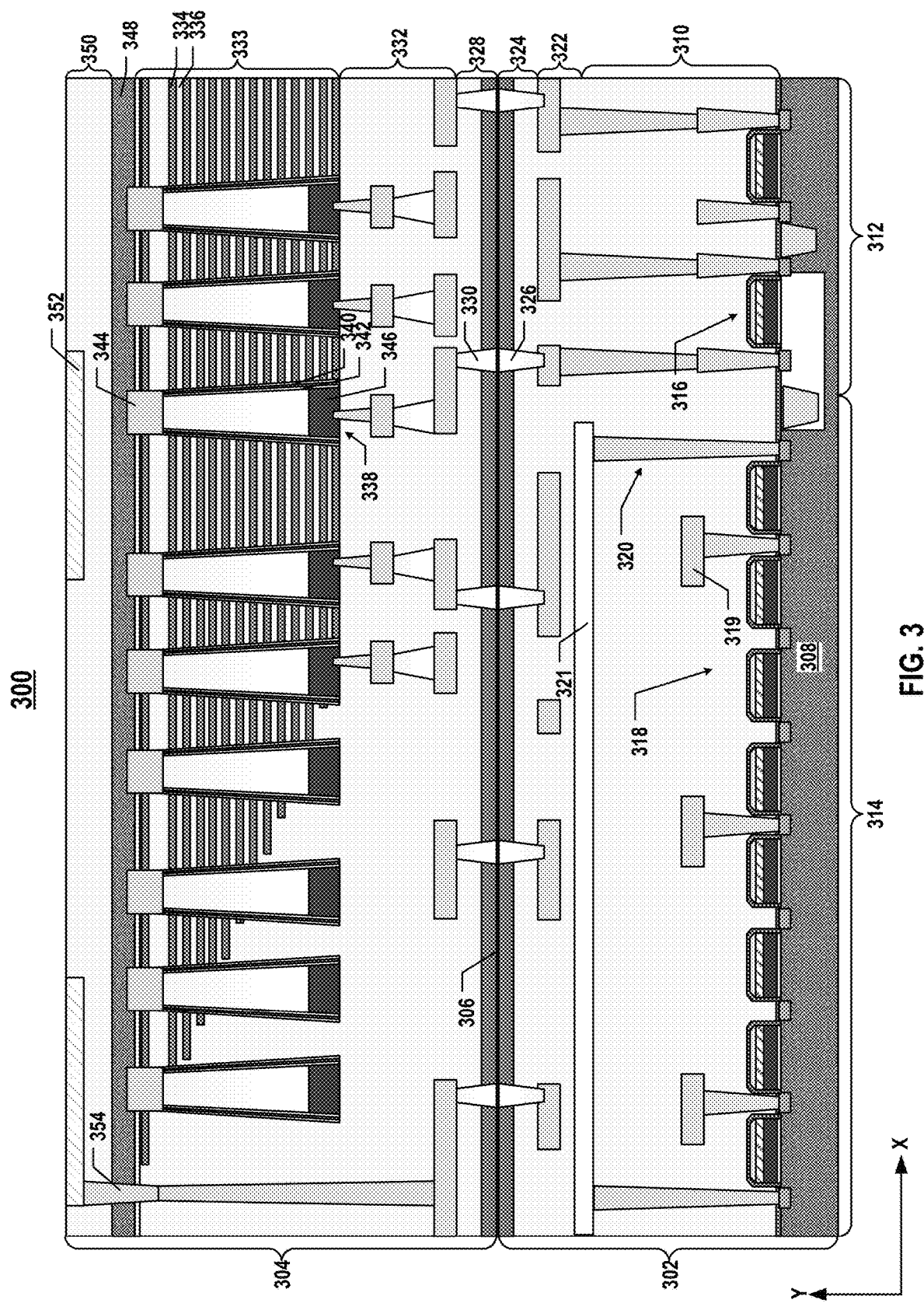
FIG. 3 illustrates a cross-section of an exemplary 3D memory device with an SRAM, according to some embodiments.

FIG. 3 illustrates a cross-section of an exemplary 3D memory device 300 with an SRAM, according to some embodiments. As one example of 3D memory device 100 described above with respect to FIG. 1A, 3D memory device 300 is a non-monolithic 3D memory device including a first semiconductor structure 302 and a second semiconductor structure 304 stacked over first semiconductor structure 302. First and second semiconductor structures 302 and 304 are joined at a bonding interface 306 therebetween. As shown in FIG. 3, first semiconductor structure 302 can include a substrate 308, which can include silicon (e.g., single crystalline silicon), silicon germanium (SiGe), gallium arsenide (GaAs), germanium (Ge), silicon on insulator (SOI), or any other suitable materials.

First semiconductor structure 302 of 3D memory device 300 can include a device layer 310 above substrate 308. It is noted that x and y axes are added in FIG. 3 to further illustrate the spatial relationship of the components in 3D memory device 300. Substrate 308 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 300) is determined relative to the substrate of the semiconductor device (e.g., substrate 308) in they-direction (the vertical direction or thickness direction) when the substrate is positioned in the lowest plane of the semiconductor device in the y-direction. The same notion for describing spatial relationships is applied throughout the present disclosure.

In some embodiments, device layer 310 includes a peripheral circuit 312 on substrate 308 and an array of SRAM cells 314 on substrate 308 and outside of peripheral circuit 312. In some embodiments, peripheral circuit 312 includes a plurality of peripheral transistors 316 forming any suitable digital, analog, and/or mixed-signal peripheral circuits used for facilitating the operation of 3D memory device 300 including, but not limited to, a page buffer, a decoder (e.g., a row decoder and a column decoder), a sense amplifier, a driver, a charge pump, a current or voltage reference. Peripheral transistors 316 can be formed "on" substrate 308, in which the entirety or part of peripheral transistors 316 are formed in substrate 308 (e.g., below the top surface of substrate 308) and/or directly on substrate 308. Isolation regions (e.g., shallow trench isolations (STIs)) and doped regions (e.g., source regions and drain regions of peripheral transistors 316) can be formed in substrate 308 as well.

In some embodiments, each SRAM cell 314 includes a plurality of SRAM transistors 318 (e.g., MOSFETs). In some embodiments, SRAM cell 314 is a 6T cell that consists of four MOSFETs for storing 1 bit of data and two MOSFETs for controlling access to the data. It is understood that SRAM cell 314 may be of any suitable configuration, such as more or fewer than six transistors (e.g., more or fewer transistors per bit). In some embodiments, SRAM transistors 318 are formed "on" substrate 308, in which the entirety or part of SRAM transistors 318 are formed in substrate 308 (e.g., below the top surface of substrate 308) and/or directly on substrate 308. Isolation regions (e.g., shallow trench isolations (STIs)) and doped regions (e.g., source regions and drain regions of SRAM transistors 318) can be formed in substrate 308 as well. As shown in FIG. 3, SRAM transistors 318 and peripheral transistors 316 can be formed in different regions on the same plane, e.g., on substrate 308. That is, SRAM transistors 318 can be formed outside of the region in which peripheral circuit 312 is formed on substrate 308. In some embodiments, the two access MOSFETs (e.g., MOSFETs that control access of data) are controlled by a word line, and the four storage MOSFETs (e.g., MOSFETs that store the bit of data) are coupled to bit lines and controlled by the two access MOSFETs. For ease of illustration, FIG. 3 only depicts a limited number of SRAM transistors 318 and the connection of SRAM transistors 318 to bit lines 319. An electrode contact 320 may be connected to electrodes of MOSFETs and a common plate 321, e.g., a common ground. It is understood that the configuration in FIG. 3, e.g., the layout of SRAM transistors and the connection between SRAM transistors 318 and bit lines 319, do not reflect the actual layout and electrical connection between SRAM transistors and other components (e.g., word lines, bit lines, and ground).

In some embodiments, first semiconductor structure 302 of 3D memory device 300 further includes an interconnect layer 322 above device layer 310 to transfer electrical signals to and from peripheral circuit 312 and array of SRAM cells 314. Interconnect layer 322 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 322 can further include one or more interlayer dielectric (ILD) layers (also known as "intermetal dielectric (IMD) layers") in which the interconnect lines and via contacts can form. That is, interconnect layer 322 can include interconnect lines and via contacts in multiple ILD layers. The interconnect lines and via contacts in interconnect layer 322 can include conductive materials including, but not limited to, tungsten (W), cobalt (Co), copper (Cu), aluminum (Al), silicides, or any combination thereof. The ILD layers in interconnect layer 322 can include dielectric materials including, but not limited to, silicon oxide, silicon nitride, silicon oxynitride, low dielectric constant (low-k) dielectrics, or any combination thereof.

As shown in FIG. 3, first semiconductor structure 302 of 3D memory device 300 can further include a bonding layer 324 at bonding interface 306 and above interconnect layer 322 and device layer 310 (including peripheral circuit 312 and array of SRAM cells 314). Bonding layer 324 can include a plurality of bonding contacts 326 and dielectrics electrically isolating bonding contacts 326. Bonding contacts 326 can include conductive materials including, but not limited to, W, Co, Cu, Al, silicides, or any combination thereof. The remaining area of bonding layer 324 can be formed with dielectrics including, but not limited to, silicon oxide, silicon nitride, silicon oxynitride, low-k dielectrics, or any combination thereof. Bonding contacts 326 and surrounding dielectrics in bonding layer 324 can be used for hybrid bonding.

Similarly, as shown in FIG. 3, second semiconductor structure 304 of 3D memory device 300 can also include a bonding layer 328 at bonding interface 306 and above bonding layer 324 of first semiconductor structure 302. Bonding layer 328 can include a plurality of bonding contacts 330 and dielectrics electrically isolating bonding contacts 330. Bonding contacts 330 can include conductive materials including, but not limited to, W, Co, Cu, Al, silicides, or any combination thereof. The remaining area of bonding layer 328 can be formed with dielectrics including, but not limited to, silicon oxide, silicon nitride, silicon oxynitride, low-k dielectrics, or any combination thereof. Bonding contacts 330 and surrounding dielectrics in bonding layer 328 can be used for hybrid bonding.

As described above, second semiconductor structure 304 can be bonded on top of first semiconductor structure 302 in a face-to-face manner at bonding interface 306. In some embodiments, bonding interface 306 is disposed between bonding layers 324 and 328 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 306 is the place at which bonding layers 324 and 328 are met and bonded. In practice, bonding interface 306 can be a layer with a certain thickness that includes the top surface of bonding layer 324 of first semiconductor structure 302 and the bottom surface of bonding layer 328 of second semiconductor structure 304.

In some embodiments, second semiconductor structure 304 of 3D memory device 300 further includes an interconnect layer 332 above bonding layer 328 to transfer electrical signals. Interconnect layer 332 can include a plurality of interconnects, such as MEOL interconnects and BEOL interconnects. Interconnect layer 332 can further include one or more ILD layers in which the interconnect lines and via contacts can form. The interconnect lines and via contacts in interconnect layer 332 can include conductive materials including, but not limited to, W, Co, Cu, Al, silicides, or any combination thereof. The ILD layers in interconnect layer 332 can include dielectric materials including, but not limited to, silicon oxide, silicon nitride, silicon oxynitride, low-k dielectrics, or any combination thereof.

In some embodiments, second semiconductor structure 304 of 3D memory device 300 includes a NAND Flash memory device in which memory cells are provided in the form of an array of 3D NAND memory strings 338 above interconnect layer 332 and bonding layer 328. Each 3D NAND memory string 338 extends vertically through a plurality of pairs each including a conductor layer 334 and a dielectric layer 336, according to some embodiments. The stacked and interleaved conductor layers 334 and dielectric layer 336 are also referred to herein as a memory stack 333. Interleaved conductor layers 334 and dielectric layers 336 in memory stack 333 alternate in the vertical direction, according to some embodiments. In other words, except for the ones at the top or bottom of memory stack 333, each conductor layer 334 can be adjoined by two dielectric layers 336 on both sides, and each dielectric layer 336 can be adjoined by two conductor layers 334 on both sides. Conductor layers 334 can each have the same thickness or different thicknesses. Similarly, dielectric layers 336 can each have the same thickness or different thicknesses. Conductor layers 334 can include conductor materials including, but not limited to, W, Co, Cu, Al, doped silicon, silicides, or any combination thereof. Dielectric layers 336 can include dielectric materials including, but not limited to, silicon oxide, silicon nitride, silicon oxynitride, or any combination thereof.

In some embodiments, each 3D NAND memory string 338 is a "charge trap" type of NAND memory string including a semiconductor channel 342 and a memory film 340. In some embodiments, semiconductor channel 342 includes silicon, such as amorphous silicon, polysilicon, or single crystalline silicon. In some embodiments, memory film 340 is a composite dielectric layer including a tunneling layer, a storage layer (also known as "charge trap/storage layer"), and a blocking layer. Each 3D NAND memory string 338 can have a cylinder shape (e.g., a pillar shape). Semiconductor channel 342, the tunneling layer, the storage layer, and the blocking layer of memory film 340 are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as an aluminum oxide ($Al_2O_3$) layer, a hafnium oxide ($HfO_2$) layer, a tantalum oxide ($Ta_2O_5$) layer, etc.

In some embodiments, 3D NAND memory strings 338 further include a plurality of control gates (each being part of a word line). Each conductor layer 334 in memory stack 333 can act as a control gate for each memory cell of 3D NAND memory string 338. In some embodiments, each 3D NAND memory string 338 includes two plugs 344 and 346 at a respective end in the vertical direction. Plug 344 can include a semiconductor material, such as single-crystal silicon, which is epitaxially grown from a semiconductor layer 348. Plug 344 can function as the channel controlled by a source select gate of 3D NAND memory string 338. Plug 344 can be at the upper end of 3D NAND memory string 338 and in contact with semiconductor channel 342. As used herein, the "upper end" of a component (e.g., 3D NAND memory string 338) is the end father away from substrate 308 in they-direction, and the "lower end" of the component (e.g., 3D NAND memory string 338) is the end closer to substrate 308 in the y-direction when substrate 308 is positioned in the lowest plane of 3D memory device 300. Another Plug 346 can include semiconductor materials (e.g., polysilicon) or conductor materials (e.g., metals). In some embodiments, plug 346 includes an opening filled with titanium/titanium nitride (Ti/TiN as a barrier layer) and tungsten (as a conductor). By covering the upper end of 3D NAND memory string 338 during the fabrication of 3D memory device 300, plug 346 can function as an etch stop layer to prevent etching of dielectrics filled in 3D NAND memory string 338, such as silicon oxide and silicon nitride. In some embodiments, plug 346 functions as the drain of 3D NAND memory string 338.

In some embodiments, first semiconductor structure 302 further includes semiconductor layer 348 disposed above memory stack 333 and 3D NAND memory strings 338. Semiconductor layer 348 can be a thinned substrate on which memory stack 333 and 3D NAND memory strings 338 are formed. In some embodiments, semiconductor layer 348 includes single-crystal silicon from which plugs 344 can be epitaxially grown. In some embodiments, semiconductor layer 348 can include polysilicon, amorphous silicon, SiGe, GaAs, Ge, or any other suitable materials. Semiconductor layer 348 can also include isolation regions and doped regions (e.g., functioning as an array common source for 3D NAND memory strings 338, not shown). Isolation regions (not shown) can extend across the entire thickness or part of the thickness of semiconductor layer 348 to electrically isolate the doped regions. In some embodiments, a pad oxide layer including silicon oxide is disposed between memory stack 333 and semiconductor layer 348.

It is understood that 3D NAND memory strings 338 are not limited to the "charge trap" type of 3D NAND memory strings and may be "floating gate" type of 3D NAND memory strings in other embodiments. Semiconductor layer 348 may include polysilicon as the source plate of the "floating gate" type of 3D NAND memory strings.

As shown in FIG. 3, second semiconductor structure 304 of 3D memory device 300 can further include a pad-out interconnect layer 350 above semiconductor layer 348. Pad-out interconnect layer 350 include interconnects, e.g., contact pads 352, in one or more ILD layers. The pad-out interconnect layer 350 and interconnect layer 332 can be formed at opposite sides of semiconductor layer 348. In some embodiments, the interconnects in pad-out interconnect layer 350 can transfer electrical signals between 3D memory device 300 and outside circuits, e.g., for pad-out purposes.

In some embodiments, second semiconductor structure 304 further includes one or more contacts 354 extending through semiconductor layer 348 to electrically connect pad-out interconnect layer 350 and interconnect layers 332 and 322. As a result, array of SRAM cells 314 can be electrically connected to array of 3D NAND memory strings 338 through interconnect layers 322 and 332 as well as bonding contacts 326 and 330. Moreover, peripheral circuit 312, array of SRAM cells 314, and array of 3D NAND memory strings 338 can be electrically connected to outside circuits through contacts 354 and pad-out interconnect layer 350.

Figure 4:
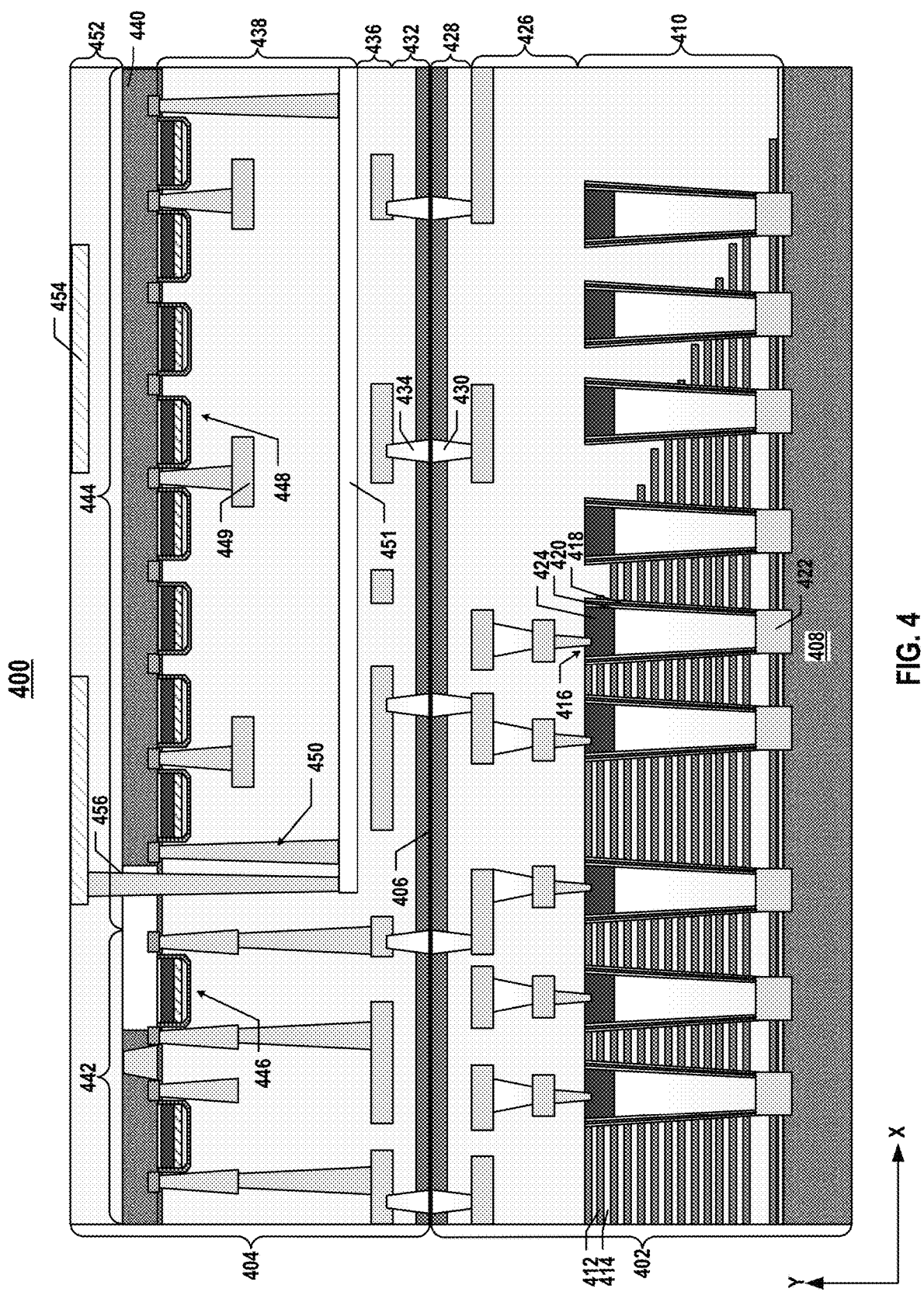
FIG. 4 illustrates a cross-section of another exemplary 3D memory device with an SRAM, according to some embodiments.

FIG. 4 illustrates a cross-section of another exemplary 3D memory device 400 with an SRAM, according to some embodiments. Similar to 3D memory device 300 described above in FIG. 3, 3D memory device 400 represents an example of a non-monolithic 3D memory device in which a first semiconductor structure 402 including 3D NAND memory strings and a second semiconductor structure 404 including peripheral circuits and SRAM cells are formed separately and bonded in a face-to-face manner at a bonding interface 406. Different from 3D memory device 300 described above in FIG. 3 in which first semiconductor structure 302 including peripheral circuits and SRAM cells is below second semiconductor structure 304 including 3D NAND memory strings, 3D memory device 400 in FIG. 4 includes second semiconductor structure 404 including peripheral circuits and SRAM cells disposed above first semiconductor structure 402 including 3D NAND memory strings. It is understood that the details of similar structures (e.g., materials, fabrication process, functions, etc.) in both 3D memory devices 300 and 400 may not be repeated below.

First semiconductor structure 402 of 3D memory device 400 can include a substrate 408 and a memory stack 410 including interleaved conductor layers 412 and dielectric layers 414 above substrate 408. In some embodiments, an array of 3D NAND memory strings 416 each extends vertically through interleaved conductor layers 412 and dielectric layers 414 in memory stack 410 above substrate 408. Each 3D NAND memory string 416 can include a semiconductor channel 420 and a memory film 418. Each 3D NAND memory string 416 further includes two plugs 422 and 424 at its lower end and upper end, respectively. 3D NAND memory strings 416 can be "charge trap" type of 3D NAND memory strings or "floating gate" type of 3D NAND memory strings. In some embodiments, a pad oxide layer including silicon oxide is disposed between memory stack 410 and substrate 408.

In some embodiments, first semiconductor structure 402 of 3D memory device 400 also includes an interconnect layer 426 above memory stack 410 and 3D NAND memory strings 416 to transfer electrical signals to and from 3D NAND memory strings 416. Interconnect layer 426 can include a plurality of interconnects, including interconnect lines and via contacts. In some embodiments, the interconnects in interconnect layer 426 also include local interconnects, such as bit line contacts and word line contacts. In some embodiments, first semiconductor structure 402 of 3D memory device 400 further includes a bonding layer 428 at bonding interface 406 and above interconnect layer 426 and memory stack 410. Bonding layer 428 can include a plurality of bonding contacts 430 and dielectrics surrounding and electrically isolating bonding contacts 430.

As shown in FIG. 4, second semiconductor structure 404 of 3D memory device 400 includes another bonding layer 432 at bonding interface 406 and above bonding layer 428. Bonding layer 432 can include a plurality of bonding contacts 434 and dielectrics surrounding and electrically isolating bonding contacts 434. In some embodiments, second semiconductor structure 404 of 3D memory device 400 also includes an interconnect layer 436 above bonding layer 432 to transfer electrical signals. Interconnect layer 436 can include a plurality of interconnects, including interconnect lines and via contacts.

Second semiconductor structure 404 of 3D memory device 400 can further include a device layer 438 above interconnect layer 436 and bonding layer 432. In some embodiments, device layer 438 includes a peripheral circuit 442 above interconnect layer 436 and bonding layer 432 and an array of SRAM cells 444 above interconnect layer 436 and bonding layer 432 and outside of peripheral circuit 442. In some embodiments, peripheral circuit 442 includes a plurality of peripheral transistors 446 forming any suitable digital, analog, and/or mixed-signal peripheral circuits used for facilitating the operation of 3D memory device 400 including, but not limited to, a page buffer, a decoder (e.g., a row decoder and a column decoder), a sense amplifier, a driver, a charge pump, a current or voltage reference. Peripheral transistors 446 can be formed "on" a semiconductor layer 440, in which the entirety or part of peripheral transistors 446 are formed in semiconductor layer 440 and/or directly on semiconductor layer 440. Isolation regions (e.g., shallow trench isolations (STIs)) and doped regions (e.g., source regions and drain regions of peripheral transistors 446) can be formed in semiconductor layer 440 as well.

In some embodiments, each SRAM cell 444 includes a plurality of SRAM transistors 448 (e.g., MOSFETs). In some embodiments, SRAM cell 444 is a 6T cell that consists of four MOSFETs for storing 1 bit of data and two MOSFETs for controlling access to the data. It is understood that SRAM cell 444 may be of any suitable configuration, such as more or fewer than six transistors (e.g., more or fewer transistors per bit). In some embodiments, SRAM transistors 448 are formed "on" semiconductor layer 440, in which the entirety or part of SRAM transistors 448 are formed in semiconductor layer 440 and/or directly on semiconductor layer 440. Isolation regions (e.g., shallow trench isolations (STIs)) and doped regions (e.g., source regions and drain regions of SRAM transistors 448) can be formed in semiconductor layer 440 as well. As shown in FIG. 4, SRAM transistors 448 and peripheral transistors 446 can be formed in different regions on the same plane, e.g., on semiconductor layer 440. That is, SRAM transistors 448 can be formed outside of the region in which peripheral circuit 442 is formed on semiconductor layer 440. In some embodiments, the two access MOSFETs (e.g., MOSFETs that control access of data) are controlled by a word line, and the four storage MOSFETs (e.g., MOSFETs that store the bit of data) are coupled to bit lines and controlled by the two access MOSFETs. For ease of illustration, FIG. 4 only depicts a limited number of SRAM transistors 448 and the connection of SRAM transistors 448 to bit lines 449. An electrode contact 450 may be connected to electrodes of MOSFETs and a common plate 451, e.g., a common ground. It is understood that the configuration in FIG. 4, e.g., the layout of SRAM transistors and the connection between SRAM transistors 448 and bit lines 449, do not reflect the actual layout and electrical connection between SRAM transistors and other components (e.g., word lines, bit lines, and ground).

In some embodiments, second semiconductor structure 404 further includes semiconductor layer 440 disposed above device layer 438. Semiconductor layer 440 can be a thinned substrate on which peripheral transistors 446 and SRAM transistors 448 are formed. In some embodiments, semiconductor layer 440 includes single-crystal silicon. In some embodiments, semiconductor layer 440 can include polysilicon, amorphous silicon, SiGe, GaAs, Ge, or any other suitable materials. Semiconductor layer 440 can also include isolation regions and doped regions.

As shown in FIG. 4, second semiconductor structure 404 of 3D memory device 400 can further include a pad-out interconnect layer 452 above semiconductor layer 440. Pad-out interconnect layer 452 include interconnects, e.g., contact pads 454, in one or more ILD layers. In some embodiments, the interconnects in pad-out interconnect layer 452 can transfer electrical signals between 3D memory device 400 and outside circuits, e.g., for pad-out purposes. In some embodiments, second semiconductor structure 404 further includes one or more contacts 456 extending through semiconductor layer 440 to electrically connect pad-out interconnect layer 452 and interconnect layers 436 and 426. As a result, array of SRAM cells 444 can be electrically connected to array of 3D NAND memory strings 416 through interconnect layers 426 and 436 as well as bonding contacts 430 and 434. Moreover, peripheral circuit 442, array of SRAM cells 444, and array of 3D NAND memory strings 416 can be electrically connected to outside circuits through contacts 456 and pad-out interconnect layer 452.

Figure 5C:
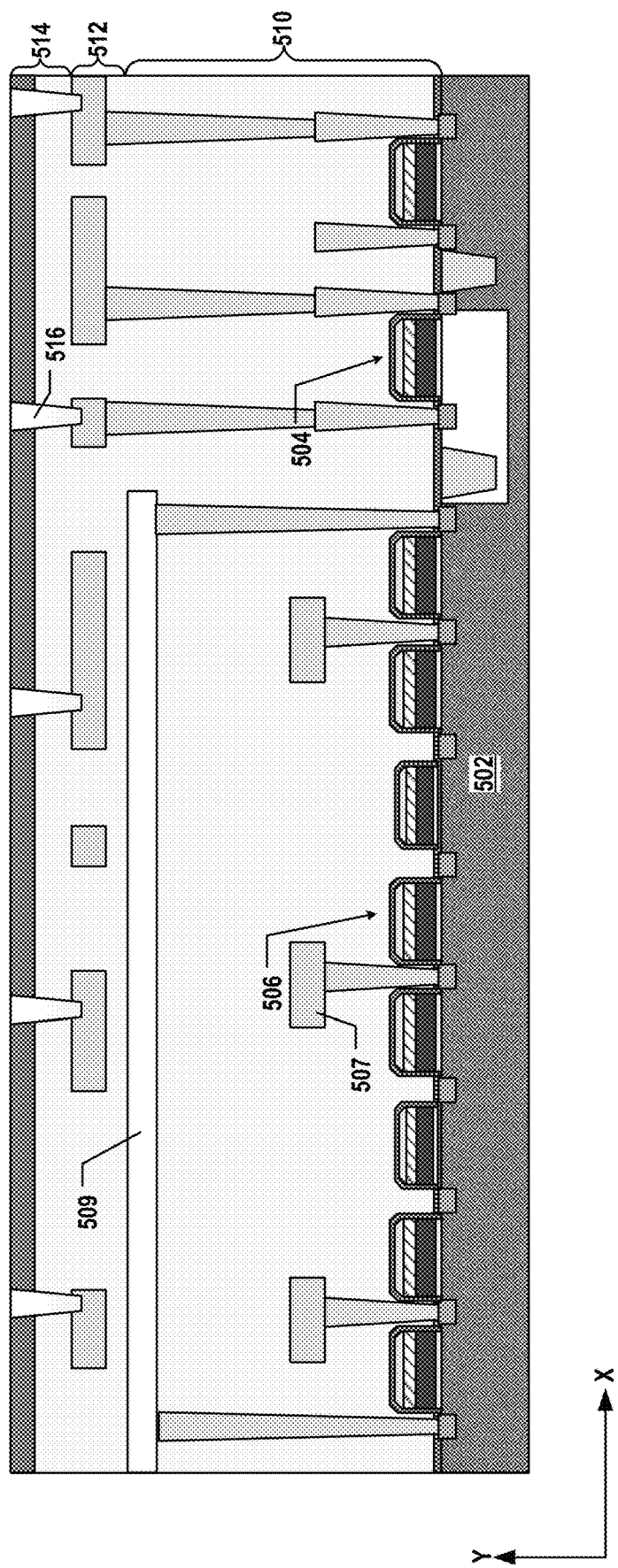
Figure 6A:
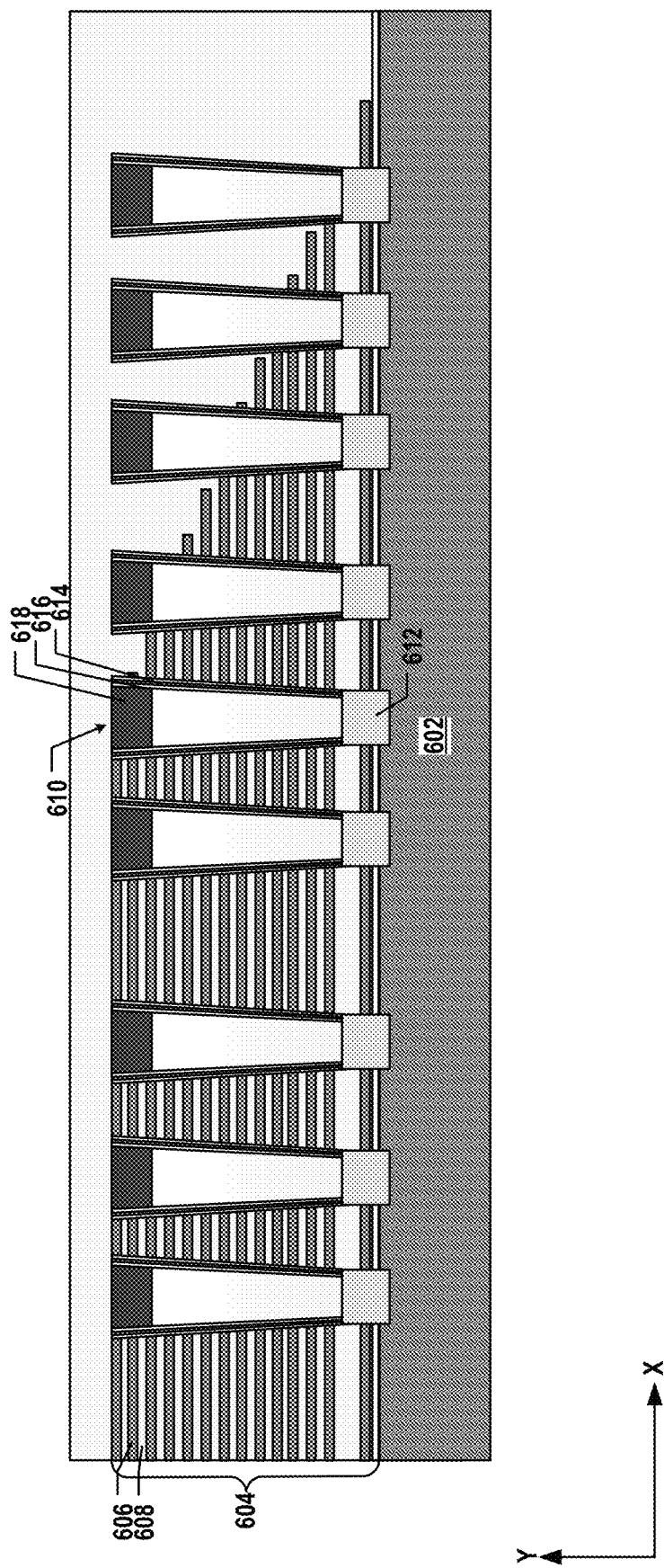
FIGS. 6A and 6B illustrate a fabrication process for forming an exemplary semiconductor structure having 3D NAND memory strings, according to some embodiments.
Figure 6B:
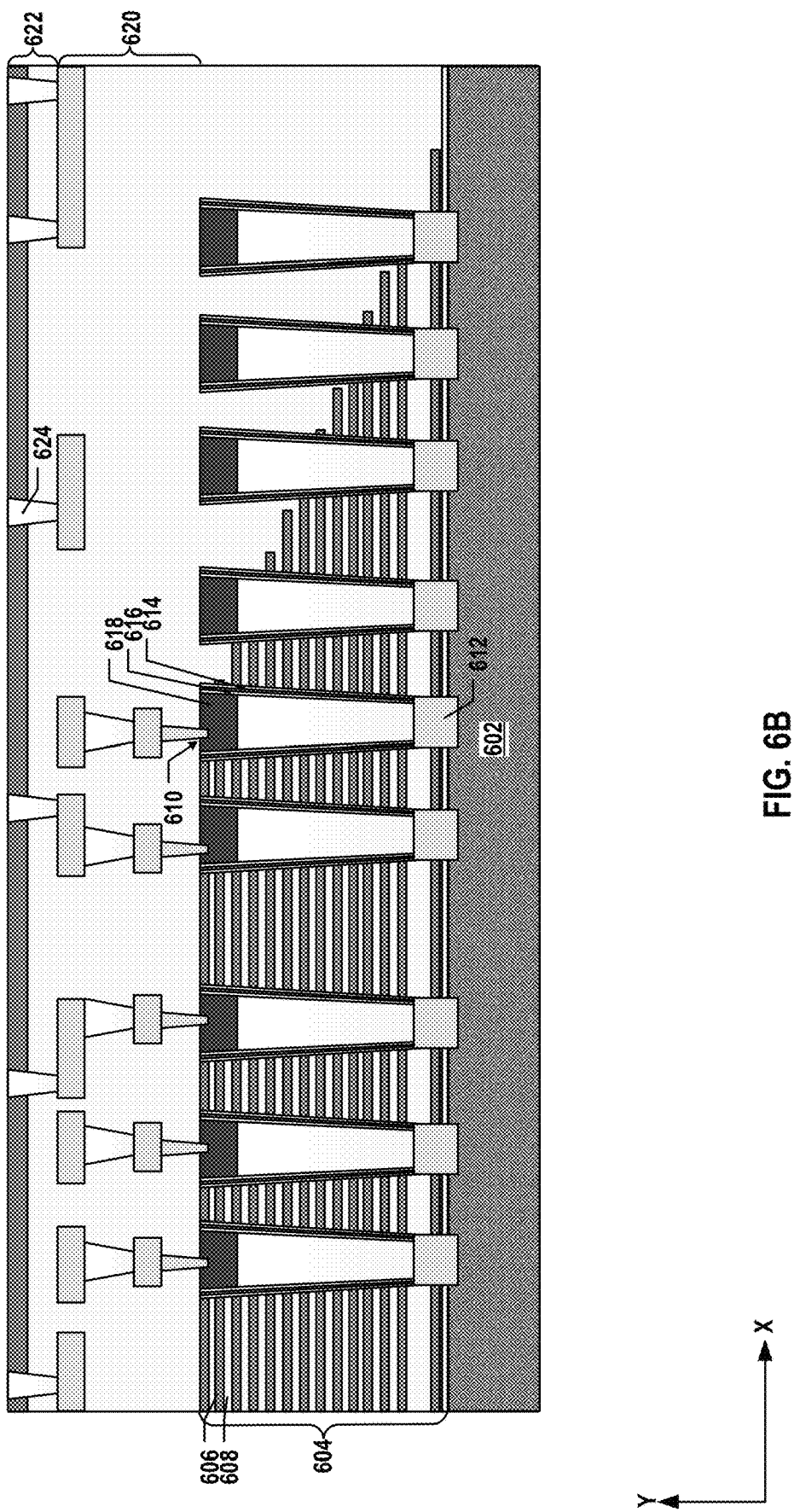
Figure 7A:
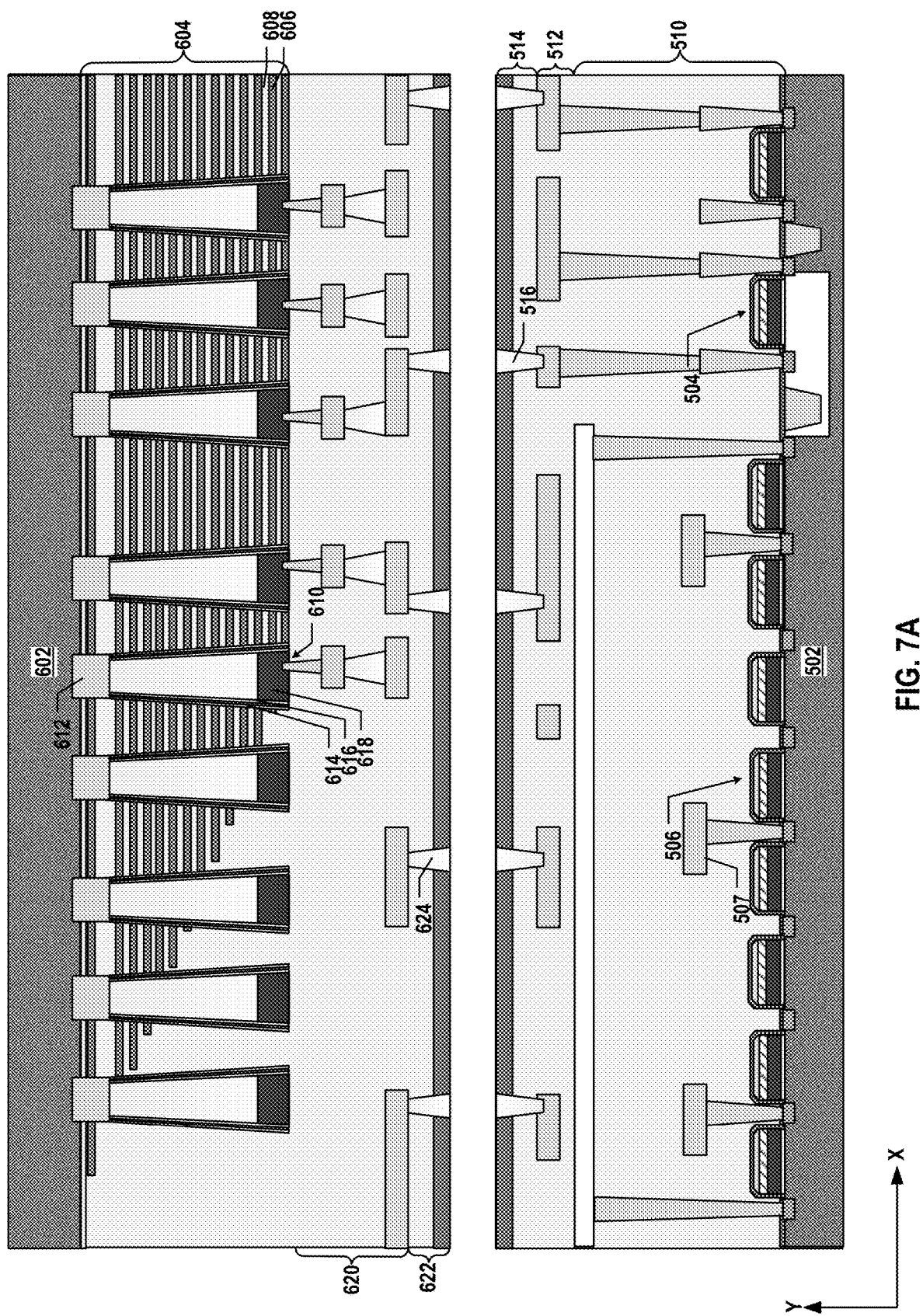
FIGS. 7A and 7B illustrate a fabrication process for forming an exemplary 3D memory device with an SRAM, according to some embodiments.
Figure 7B:
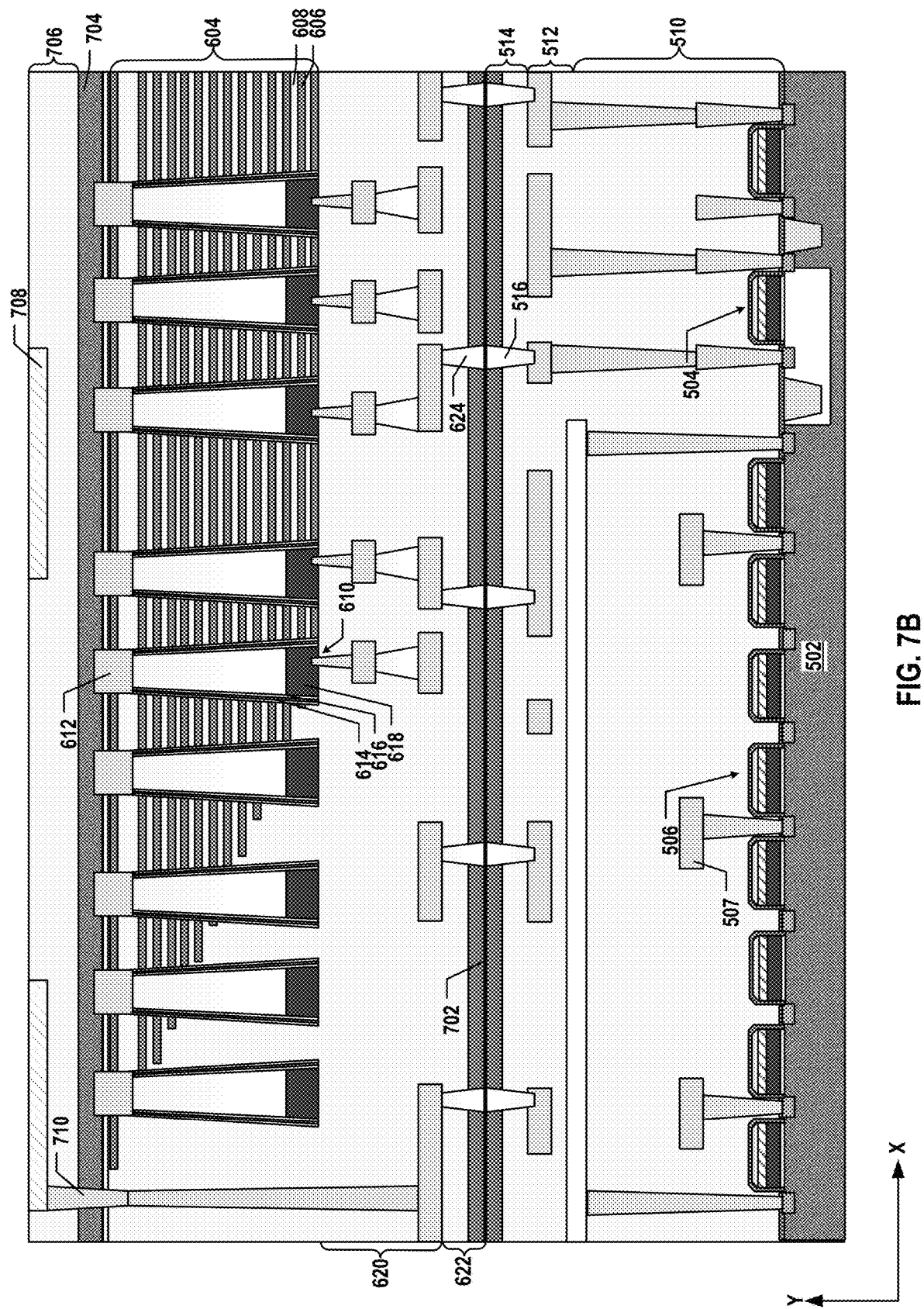
Figure 12:
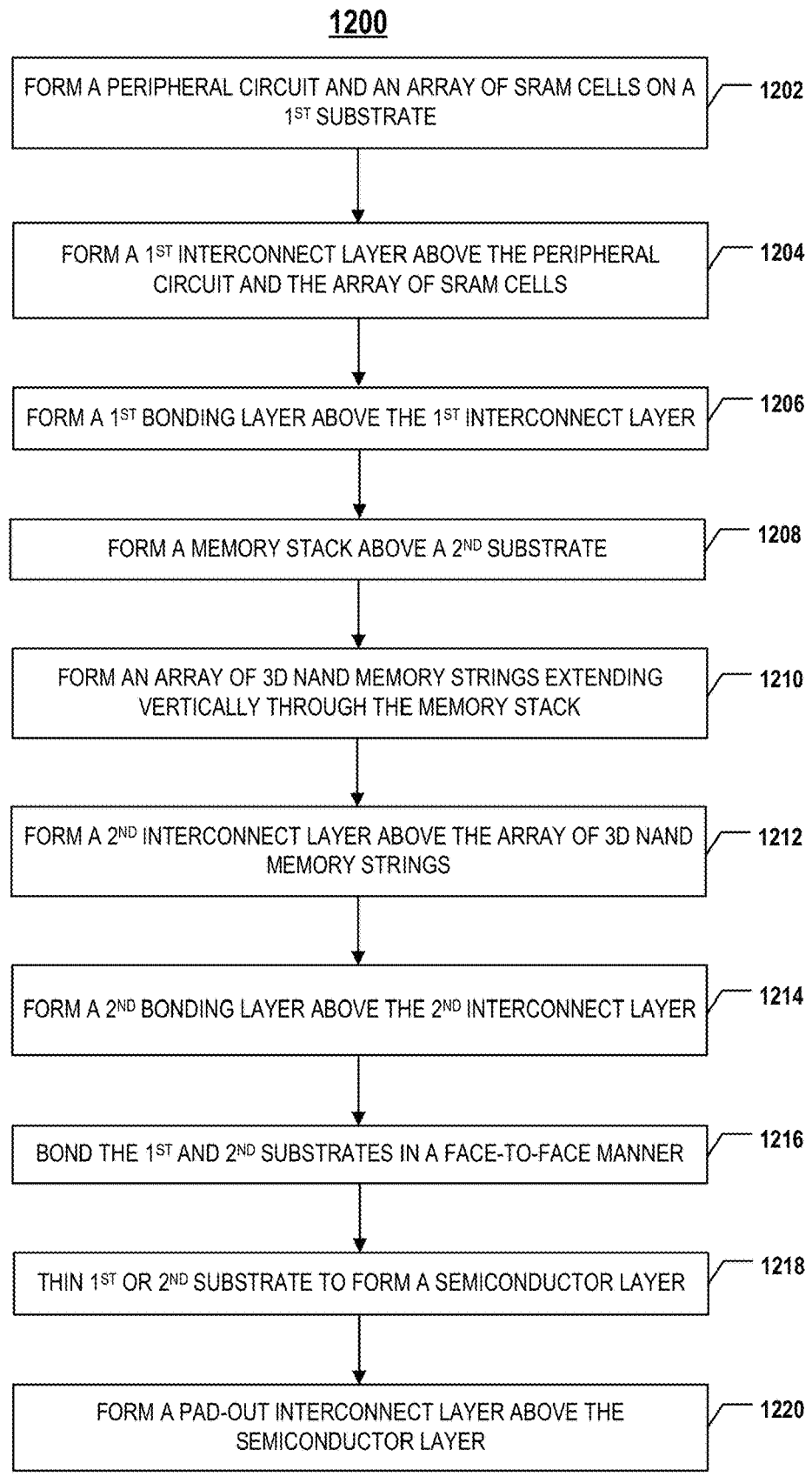
FIG. 12 is a flowchart of an exemplary method for forming a 3D memory device with an SRAM, according to some embodiments.

FIGS. 5A-5C illustrate a fabrication process for forming an exemplary semiconductor structure having a peripheral circuit and an SRAM, according to some embodiments. FIGS. 6A and 6B illustrate a fabrication process for forming an exemplary semiconductor structure having 3D NAND memory strings, according to some embodiments. FIGS. 7A and 7B illustrate a fabrication process for forming an exemplary 3D memory device with an SRAM, according to some embodiments. FIG. 12 is a flowchart of an exemplary method 1200 for forming a 3D memory device with an SRAM, according to some embodiments. Examples of the 3D memory device depicted in FIGS. 5-7 and 12 include 3D memory device 300 depicted in FIGS. 3 and 3D memory device 400 depicted in FIG. 4. FIGS. 5-7 and 12 will be described together. It is understood that the operations shown in method 1200 are not exhaustive and that other operations can be performed as well before, after, or between any of the illustrated operations. Further, some of the operations may be performed simultaneously, or in a different order than shown in FIG. 12.

As depicted in FIGS. 5A-5C, a first semiconductor structure including a peripheral circuit, an array of SRAM cells, and a first bonding layer including a plurality of first bonding contacts is formed. As depicted in FIGS. 6A and 6B, a second semiconductor structure including an array of 3D NAND memory strings and a second bonding layer including a plurality of second bonding contacts is formed. As depicted in FIGS. 7A and 7B, the first semiconductor structure and the second semiconductor structure are bonded in a face-to-face manner, such that the first bonding contacts are in contact with the second bonding contacts at a bonding interface.

Referring to FIG. 12, method 1200 starts at operation 1202, in which the peripheral circuit and the array of SRAM cells are formed on a first substrate. The first substrate can be a silicon substrate. In some embodiments, to form the peripheral circuit and the array of SRAM cells, a plurality of transistors are formed on the first substrate. As illustrated in FIG. 5A, a plurality of transistors (e.g., peripheral transistors 504 and SRAM transistors 506) are formed on a silicon substrate 502. Transistors 504 and 506 can be formed by a plurality of processes including, but not limited to, photolithography, dry/wet etch, thin film deposition, thermal growth, implantation, chemical mechanical polishing (CMP), and any other suitable processes. In some embodiments, doped regions are formed in silicon substrate 502 by ion implantation and/or thermal diffusion, which function, for example, as source regions and/or drain regions of transistors 504 and 506. In some embodiments, isolation regions (e.g., STIs) are also formed in silicon substrate 502 by wet/dry etch and thin film deposition.

As illustrated in FIG. 5B, bit lines 507 and common plates 509 are formed as well for connecting SRAM transistors 506. A device layer 510 including a peripheral circuit (having peripheral transistors 504) and an array of SRAM cells (each having a plurality of SRAM transistors 506) is thereby formed.

Method 1200 proceeds to operation 1204, as illustrated in FIG. 12, in which a first interconnect layer is formed above the peripheral circuit and the array of SRAM cells. The first interconnect layer can include a first plurality of interconnects in one or more ILD layers. As illustrated in FIG. 5C, an interconnect layer 512 can be formed above device layer 510 including the peripheral circuit (having peripheral transistors 504) and the array of SRAM cells (each having SRAM transistor 506). Interconnect layer 512 can include interconnects of MEOL and/or BEOL in a plurality of ILD layers to make electrical connections with device layer 510. In some embodiments, interconnect layer 512 includes multiple ILD layers and interconnects therein formed in multiple processes. For example, the interconnects in interconnect layers 512 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 5C can be collectively referred to as interconnect layer 512.

Method 1200 proceeds to operation 1206, as illustrated in FIG. 12, in which a first bonding layer is formed above the first interconnect layer. The first bonding layer can include a plurality of first bonding contacts. As illustrated in FIG. 5C, a bonding layer 514 is formed above interconnect layer 512. Bonding layer 514 can include a plurality of bonding contacts 516 surrounded by dielectrics. In some embodiments, a dielectric layer is deposited on the top surface of interconnect layer 512 by one or more thin film deposition processes including, but not limited to, CVD, PVD, ALD, or any combination thereof. Bonding contacts 516 then can be formed through the dielectric layer and in contact with the interconnects in interconnect layer 512 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 1200 proceeds to operation 1208, as illustrated in FIG. 12, in which a memory stack is formed above a second substrate. The second substrate can be a silicon substrate. As illustrated in FIG. 6A, interleaved sacrificial layers (not shown) and dielectric layers 608 are formed above a silicon substrate 602. The interleaved sacrificial layers and dielectric layers 608 can form a dielectric stack (not shown). In some embodiments, each sacrificial layer includes a layer of silicon nitride, and each dielectric layer 608 includes a layer of silicon oxide. The interleaved sacrificial layers and dielectric layers 608 can be formed by one or more thin film deposition processes including, but not limited to, CVD, PVD, ALD, or any combination thereof. In some embodiments, a memory stack 604 can be formed by a gate replacement process, e.g., replacing the sacrificial layers with conductor layers 606 using wet/dry etch of the sacrificial layers selective to dielectric layers 608 and filling the resulting recesses with conductor layers 606. As a result, memory stack 604 can include interleaved conductor layers 606 and dielectric layers 608. In some embodiments, each conductor layer 606 includes a metal layer, such as a layer of tungsten. It is understood that memory stack 604 may be formed by alternatingly depositing conductor layers (e.g., doped polysilicon layers) and dielectric layers (e.g., silicon oxide layers) without the gate replacement process in other embodiments. In some embodiments, a pad oxide layer including silicon oxide is formed between memory stack 604 and silicon substrate 602.

Method 1200 proceeds to operation 1210, as illustrated in FIG. 12, in which the array of 3D NAND memory strings extending vertically through the memory stack are formed. As illustrated in FIG. 6A, 3D NAND memory strings 610 are formed above silicon substrate 602, each of which extends vertically through interleaved conductor layers 606 and dielectric layers 608 of memory stack 604. In some embodiments, fabrication processes to form 3D NAND memory string 610 include forming a channel hole through memory stack 604 and into silicon substrate 602 using dry etching/and or wet etching, such as deep reactive-ion etching (DRIE), followed by epitaxially growing a plug 612 in the lower portion of the channel hole from silicon substrate 602. In some embodiments, fabrication processes to form 3D NAND memory string 610 also include subsequently filling the channel hole with a plurality of layers, such as a memory film 614 (e.g., a tunneling layer, a storage layer, and a blocking layer) and a semiconductor layer 616, using thin film deposition processes such as ALD, CVD, PVD, or any combination thereof. In some embodiments, fabrication processes to form 3D NAND memory string 610 further include forming another plug 618 in the upper portion of the channel hole by etching a recess at the upper end of 3D NAND memory string 610, followed by filling the recess with a semiconductor material using thin film deposition processes such as ALD, CVD, PVD, or any combination thereof.

Method 1200 proceeds to operation 1212, as illustrated in FIG. 12, in which a second interconnect layer is formed above the array of 3D NAND memory strings. The second interconnect layer can include a second plurality of interconnects in one or more ILD layers. As illustrated in FIG. 6B, an interconnect layer 620 can be formed above memory stack 604 and array of 3D NAND memory strings 610. Interconnect layer 620 can include interconnects of MEOL and/or BEOL in a plurality of ILD layers to make electrical connections with 3D NAND memory strings 610. In some embodiments, interconnect layer 620 includes multiple ILD layers and interconnects therein formed in multiple processes. For example, the interconnects in interconnect layers 620 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 6B can be collectively referred to as interconnect layer 620.

Method 1200 proceeds to operation 1214, as illustrated in FIG. 12, in which a second bonding layer is formed above the second interconnect layer. The second bonding layer can include a plurality of second bonding contacts. As illustrated in FIG. 6B, a bonding layer 622 is formed above interconnect layer 620. Bonding layer 622 can include a plurality of bonding contacts 624 surrounded by dielectrics. In some embodiments, a dielectric layer is deposited on the top surface of interconnect layer 620 by one or more thin film deposition processes including, but not limited to, CVD, PVD, ALD, or any combination thereof. Bonding contacts 624 then can be formed through the dielectric layer and in contact with the interconnects in interconnect layer 620 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 1200 proceeds to operation 1216, as illustrated in FIG. 12, in which the first substrate and the second substrate are bonded in a face-to-face manner, such that the first bonding contacts are in contact with the second bonding contacts at the bonding interface. The bonding can be hybrid bonding. In some embodiments, the first substrate on which the peripheral circuit and SRAM cells are formed (e.g., the first semiconductor structure) is disposed above the second substrate on which the 3D NAND memory strings are formed (e.g., the second semiconductor structure) after the bonding. In some embodiments, the second substrate on which the 3D NAND memory strings are formed (e.g., the second semiconductor structure) is disposed above the first substrate on which the peripheral circuit and SRAM cells are formed (e.g., the first semiconductor structure) after the bonding.

As illustrated in FIG. 7A, silicon substrate 602 and components formed thereon (e.g., 3D NAND memory strings 610) are flipped upside down. Bonding layer 622 facing down is bonded with bonding layer 514 facing up, i.e., in a face-to-face manner, thereby forming a bonding interface 702 (as shown in FIG. 7B). In some embodiments, a treatment process, e.g., a plasma treatment, a wet treatment, and/or a thermal treatment, is applied to the bonding surfaces prior to the bonding. Although not shown in FIG. 7A, silicon substrate 502 and components formed thereon (e.g., device layer 510) can be flipped upside down, and bonding layer 514 facing down can be bonded with bonding layer 622 facing up, i.e., in a face-to-face manner, thereby forming bonding interface 702. After the bonding, bonding contacts 624 in bonding layer 622 and bonding contacts 516 in bonding layer 514 are aligned and in contact with one another, such that device layer 510 (e.g., the peripheral circuit and SRAM cells therein) can be electrically connected to 3D NAND memory strings 610. It is understood that in the bonded device, 3D NAND memory strings 610 may be either above or below device layer 510 (e.g., the peripheral circuit and SRAM cells therein). Nevertheless, bonding interface 702 can be formed between 3D NAND memory strings 610 and device layer 510 (e.g., the peripheral circuit and SRAM cells therein) after the bonding as illustrated in FIG. 7B.

Method 1200 proceeds to operation 1218, as illustrated in FIG. 12, in which the first substrate or the second substrate is thinned to form a semiconductor layer. In some embodiments, the first substrate of the first semiconductor structure, which is above the second substrate of the second semiconductor structure after the bonding, is thinned to form the semiconductor layer. In some embodiments, the second substrate of the second semiconductor structure, which is above the first substrate of the first semiconductor structure after the bonding, is thinned to form the semiconductor layer.

As illustrated in FIG. 7B, the substrate on top of the bonded 3D memory device (e.g., silicon substrate 402 as shown in FIG. 7A) is thinned, so that the thinned top substrate can serve as a semiconductor layer 704, for example, a single-crystal silicon layer. The thickness of the thinned substrate can be between about 200 nm and about 5 μm, such as between 200 nm and 5 μm, or between about 150 nm and about 50 μm, such as between 150 nm and 50 μm. Silicon substrate 402 can be thinned by processes including, but not limited to, wafer grinding, dry etch, wet etch, CMP, any other suitable processes, or any combination thereof. It is understood that when silicon substrate 502 is the substrate on top of the bonded 3D memory device, another semiconductor layer may be formed by thinning silicon substrate 502.

Method 1200 proceeds to operation 1220, as illustrated in FIG. 12, in which a pad-out interconnect layer is formed above the semiconductor layer. As illustrated in FIG. 7B, a pad-out interconnect layer 706 is formed above semiconductor layer 704 (the thinned top substrate). Pad-out interconnect layer 706 can include interconnects, such as pad contacts 708, formed in one or more ILD layers. Pad contacts 708 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 710 are formed extending vertically through semiconductor layer 704, for example by wet/dry etch followed by depositing conductive materials. Contacts 710 can be in contact with the interconnects in pad-out interconnect layer 706.

Figure 8:
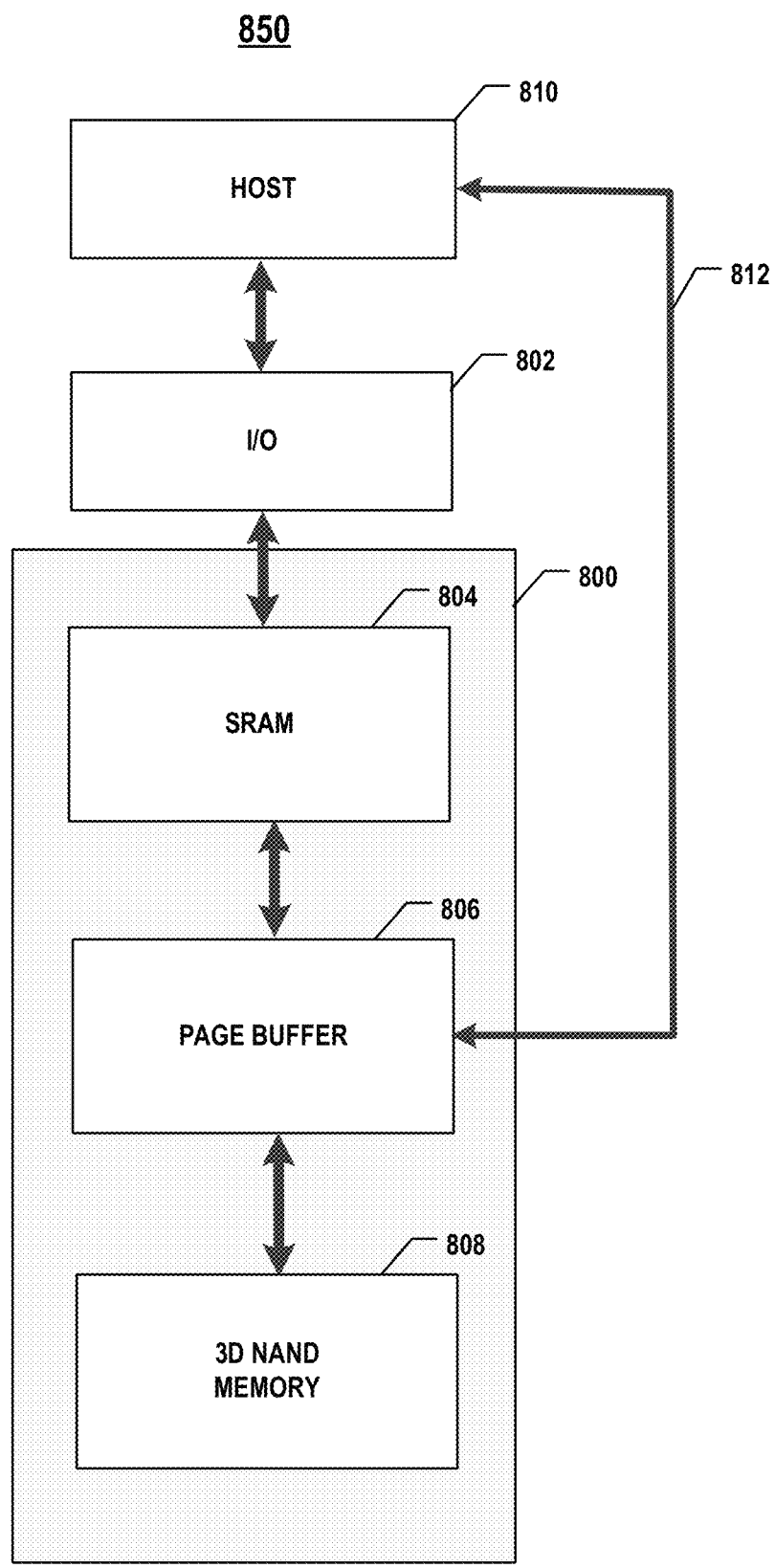
FIG. 8 illustrates a schematic block diagram of an exemplary system having a 3D memory device with an SRAM, according to some embodiments.
Figure 9A:
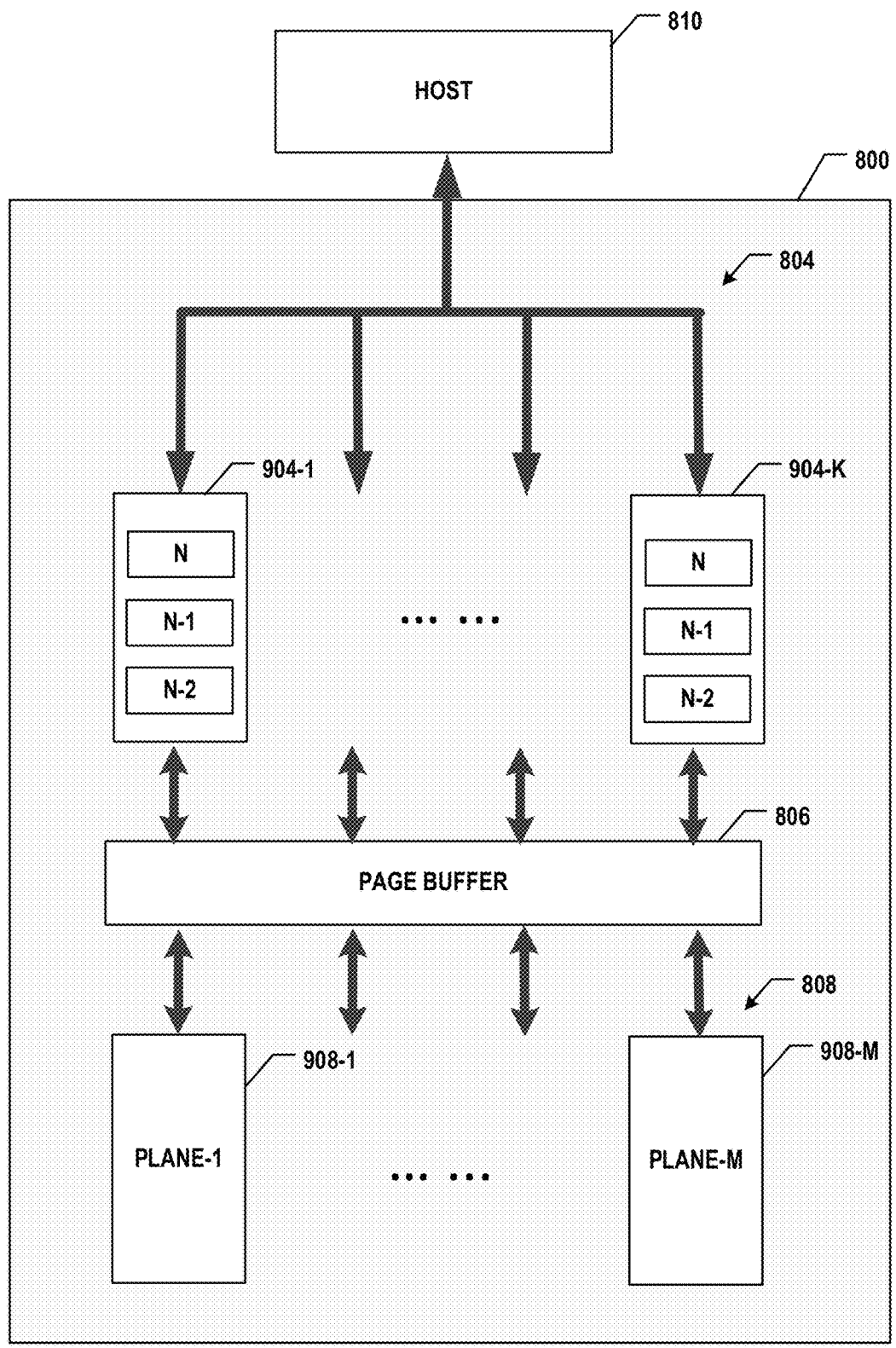
FIG. 9A illustrates a schematic block diagram of an exemplary system having a 3D memory device using SRAM as an on-die cache, according to some embodiments.
Figure 9B:
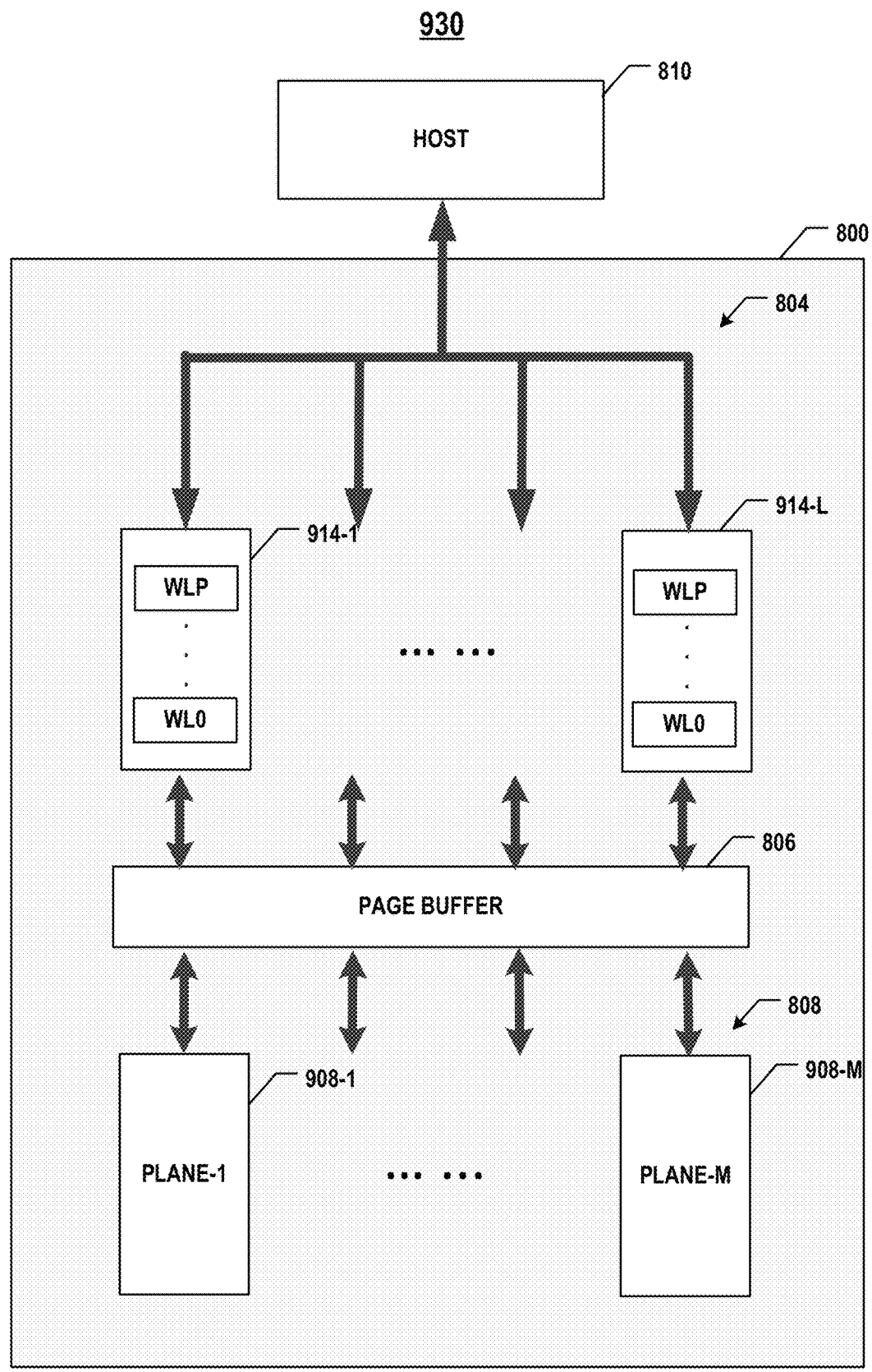
FIG. 9B illustrates a schematic block diagram of an exemplary system having a 3D memory device using SRAM as an on-die data buffer, according to some embodiments.
Figure 10:
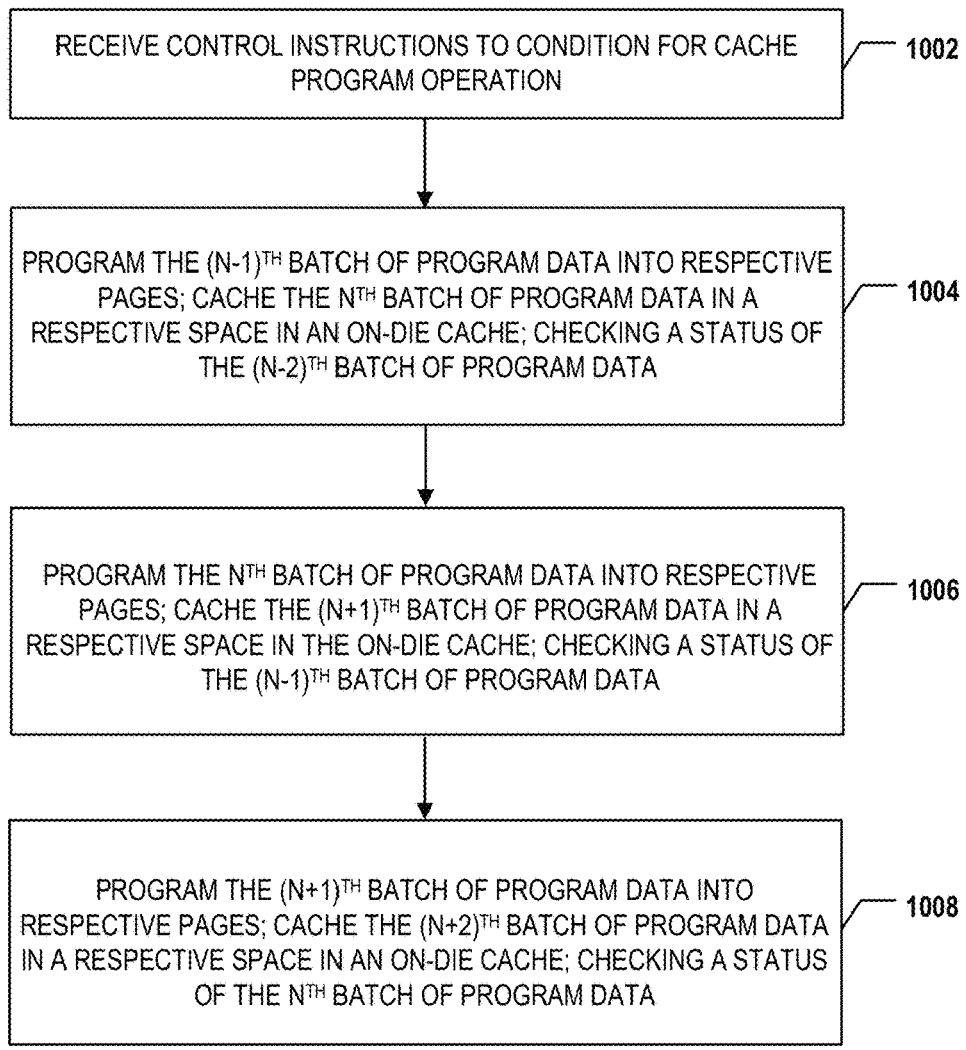
FIG. 10 is a flowchart of an exemplary method for operating a 3D memory device with an SRAM, according to some embodiments.
Figure 11:
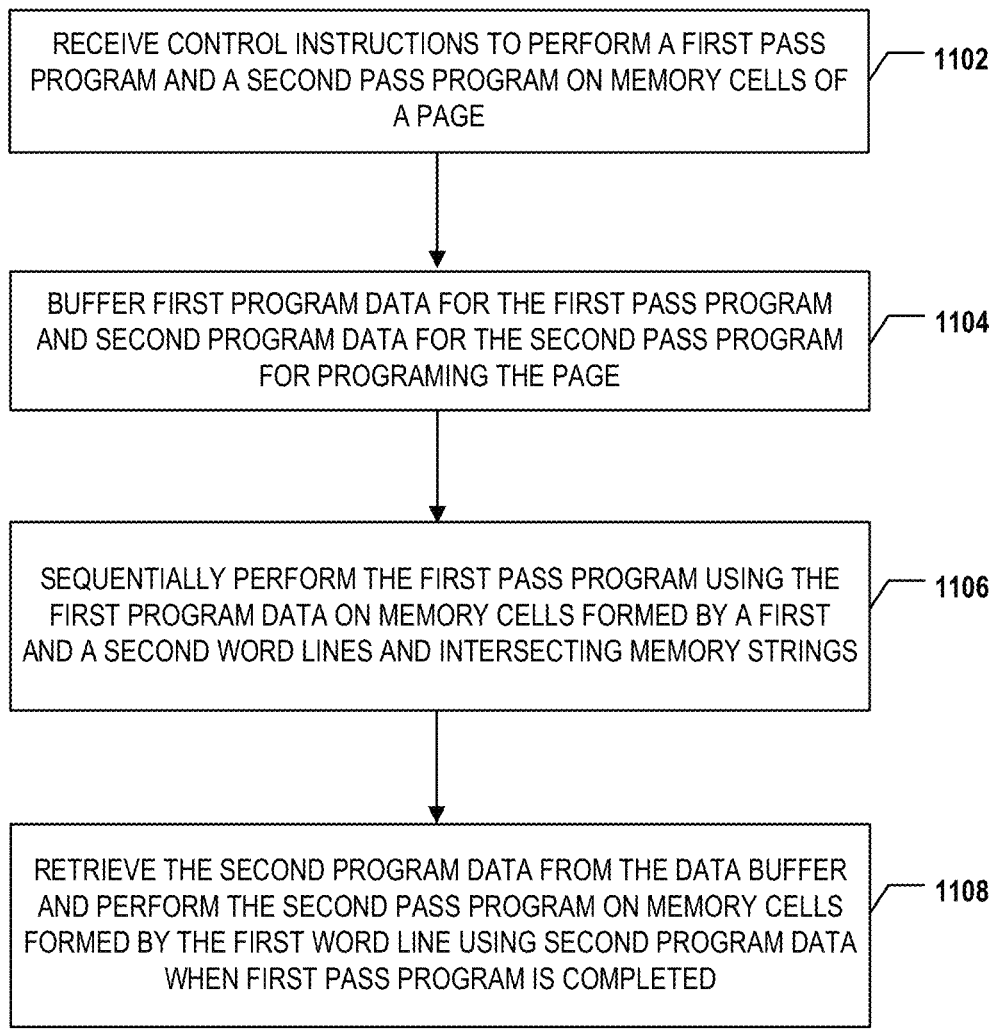
FIG. 11 is a flowchart of another exemplary method for operating a 3D memory device with an SRAM, according to some embodiments.

FIG. 8 illustrates a schematic block diagram of an exemplary system 850 having a 3D memory device with an on-die SRAM, according to some embodiments. FIG. 9A illustrates a schematic block diagram of system 920 having a 3D memory device with an on-die SRAM as a cache, according to some embodiments. FIG. 9B illustrates a schematic block diagram of system 930 having a 3D memory device with an on-die SRAM as a data buffer, according to some embodiments. FIG. 10 is a flowchart of an exemplary method 1000 for operating a 3D memory device with an on-die SRAM as a cache, according to some embodiments. FIG. 11 is a flowchart of an exemplary method 1100 for operating a 3D memory device with an on-die SRAM as a data buffer, according to some embodiments. Examples of the systems illustrated in FIGS. 9A and 9B are described together with FIGS. 10 and 11, respectively. It is understood that the operations shown in methods 1000 and 1100 are not exhaustive and that other operations can be performed as well before, after, or between any of the illustrated operations. Further, some of the operations may be performed simultaneously, or in a different order than shown in FIGS. 10 and 11.

FIG. 8 illustrates a system 850 having an SRAM used as a cache or a data buffer, according to some embodiments. System 850 may have a host 810, an I/O 802, an SRAM 804, a page buffer 806, and a 3D NAND memory 808. In some embodiments, SRAM 804 is formed on the same chip with page buffer 806 and 3D NAND memory 808, as described above in detail. In some embodiments, SRAM 804, page buffer 806, and 3D NAND memory 808 form a 3D memory device 800. SRAM 804 can be referred to as an on-die SRAM or an on-NAND SRAM. Data, e.g., program data and control instructions, may be transmitted bi-directionally between host 810 and I/O 802, between I/O 802 and SRAM 804, between SRAM 804 and page buffer 806, and between 3D NAND memory 808 and page buffer 806. Data transmission 812 between host 810 and page buffer 806 may be enabled or disabled, depending on the functions of SRAM 804. For example, when SRAM 804 functions as a cache in 3D memory device 800, data transmission 812 can be bi-directional data transmission between host 810 and page buffer 806; when SRAM 804 functions as a data buffer in 3D memory device 800, data transmission 812 may be disabled. That is, when SRAM 804 functions as a cache, data transmission 812 allows 3D memory device 800 to program 3D NAND memory 808 using program data from host 810 and host 810 to extract program data from page buffer 806 at the same time; when SRAM 804 functions as a data buffer, 3D memory device 800 sequentially buffers program data from host 810 in SRAM 804 and program the buffered program data into 3D NAND memory 808.

Host 810 can be any suitable devices that generate the data, such as one or more processors. In some embodiments, host 810 includes a central processing unit (CPU), a graphics processor (e.g., graphics processing unit (GPU)), an application processor (AP), a general processor (e.g., APU, accelerated processing unit; GPGPU, general-purpose computing on GPU), or any other suitable processor. Input/output circuit 802 can be a high-speed, high-throughput input/output circuit as part of the peripheral circuits. In some embodiments, host 810 includes a system controller (e.g., a controller that controls various operations of system 850) and/or a memory controller (e.g., a controller that controls various operations of 3D memory device 800). Any suitable type of data generated by a host 810 is transferred to SRAM 804 of 3D memory device 800 through I/O 802. Host 810 and 3D memory device 800 can be part of any suitable apparatus, for example, a virtual reality (VR)/augmented reality (AR) device (e.g., VR headset, etc.), handheld device (e.g., dumb or smart phone, tablet, etc.), wearable device (e.g., eyeglasses, wrist watch, etc.), automobile control station, gaming console, television set, laptop computer, desktop computer, netbook computer, media center, set-top box, global positioning system (GPS), printer, or any other suitable device.

In some embodiments, SRAM 804 includes a plurality of SRAM cells, arranged in an array or an arbitrary pattern. Details of SRAM cells can be found in the description of FIGS. 3-5C and thus, are not repeated herein. SRAM 804 may be connected to page buffer 806, which includes a plurality of buffering sections connected to respective pages in 3D NAND memory 808.

SRAM 804 may be employed as a high-speed on-die cache of 3D memory device 800 to improve sequential programming. FIG. 9A illustrates system 920 in which SRAM 804 functions as a high-speed on-die cache. For ease of depiction, I/O 802 is omitted in FIG. 9A. In some embodiments, data is programmed into 3D NAND memory 808 in pages, and SRAM 804 is illustrated as a plurality of cache units 904 (i.e., 904-1, . . . , 904-K), each being configured to cache program data for programming a page in 3D NAND memory 808. 3D NAND memory 808 may be depicted as a plurality of planes 908 (i.e., 908-1, . . . , 908-M), each representing memory cells formed by a word line and intersecting memory strings. A plane 908 may include a plurality of pages of memory cells. K and M may each be a positive integer and may or may not be the same as each other. In operation, the plurality of cache units 904 can cache program data of the same batch into page buffer 806 at the same time. Cache units 904 further inputs cached program data into page buffer 806, which then inputs the cached program data into respective pages in planes 908. In some embodiments, host 810 sequentially (e.g., one batch immediately after another batch) transmits batches of program data, e.g., $(N-3)^{th}$, $(N-2)^{th}$, $(N-1)^{th}$, $N^{th}$, $(N+1)^{th}$, and $(N+2)^{th}$, into SRAM 804 and/or page buffer 806.

Referring to FIG. 10, method 1000 starts at operation 1002, in which 3D memory device 800 receives control instructions, from host 810, to condition 3D memory device 800 for a cache program operation. In some embodiments, 3D memory device 800 follows the control instructions to initialize SRAM cells of SRAM 804, e.g., erase data in/empty SRAM cells so SRAM 804 is ready to receive program data.

At operation 1004, 3D memory device 800 programs an $(N-1)^{th}$ batch of program data into respective pages. At the same time, 3D memory device 800 caches an $N^{th}$ batch of program data in a respective space (e.g., cache unit) in SRAM 804 and check the status of an $(N-2)^{th}$ batch of program data. SRAM 804 can cache a plurality of batches of program data. In some embodiments, SRAM caches at most three batches of program data, e.g., as $(N-2)^{th}$, $(N-1)^{th}$, and $N^{th}$ batches of program data shown in FIG. 9A. Each batch of program data (e.g., $(N-2)^{th}$ batch, $(N-1)^{th}$ batch, and $N^{th}$ batch) may include program data for one or more pages in respective planes. For example, each batch of program data may include program data for K pages and the program data for each page can be cached in a respective cache unit (e.g., 904-1, . . . , 904-K). The cached batch of program data may be a backup copy of the respective program data and can be programmed into 3D NAND memory 808, if necessary, e.g., the programming of respective program data to 3D NAND memory 808 fails. Details are described below.

In some embodiments, checking the status of $(N-2)^{th}$ batch of program data, programming $(N-1)^{th}$ batch of program data, and caching $N^{th}$ batch of program data, are performed at the same time or in a same time span. For example, these operations may start and complete at about the same time or may have overlapping operation times. In some embodiments, when 3D memory device 800 is programming $(N-1)^{th}$ batch of program data from page buffer 806 into 3D NAND memory 808, 3D memory device 800 is caching $N^{th}$ batch of program data from host 810 and checking the status of $(N-2)^{th}$ batch of program data. 3D memory device 800 may program $(N-1)^{th}$ batch of program data by transmitting a copy of $(N-1)^{th}$ batch of program data from page buffer 806. The copy of $(N-1)^{th}$ batch of program data may be formed by buffering $(N-1)^{th}$ batch of program data (e.g., before the caching of $N^{th}$ batch of program data) from host 810 or by buffering the backup copy of $(N-1)^{th}$ batch of program data from SRAM 804. In some embodiments, 3D memory device 800 programs $(N-1)^{th}$ batch of program data by loading the copy of $(N-1)^{th}$ batch of program data from page buffer 806 to 3D NAND memory 808 when caching $N^{th}$ batch of program data into SRAM 804 from host 810. The copy of $(N-1)^{th}$ batch of program data may be formed by buffering $(N-1)^{th}$ batch of program data through data transmission 812 from host 810, e.g., before the programming starts. In some embodiments, the backup copy of $(N-1)^{th}$ batch of program data is cached in SRAM 804 when 3D memory device 800 is checking the status of an $(N-3)^{th}$ batch of program data. In some embodiments, $(N-1)^{th}$ batch of program data is cached from host 810 into SRAM 804 to form a backup copy of the $(N-1)^{th}$ batch of program data when $(N-2)^{th}$ batch of program data is being programmed into respective pages in 3D NAND memory 808.

In some embodiments, the checking of the status of the $(N-2)^{th}$ batch of program data includes determining whether the programming of $(N-2)^{th}$ batch of program data was successful. In some embodiments, if the programming of $(N-2)^{th}$ batch of program data failed, 3D memory device 800 retrieves a backup copy of $(N-2)^{th}$ batch of program data from SRAM 804, buffers the backup copy of $(N-2)^{th}$ batch of program data in page buffer 806, and programs the backup copy of the $(N-2)^{th}$ batch of program data into respective pages in 3D NAND memory 808. In some embodiments, SRAM 804 maintains the backup copy of $(N-2)^{th}$ batch of program data when checking the status of programming of (N−2)$^{th}$ batch of program data and removes the backup copy of (N−2)$^{th}$ batch of program data when the programming of (N−2)$^{th}$ batch of program is successful. SRAM 804 may then have space for caching another batch (e.g., (N+1)$^{th}$ batch of program data) of program data.

N$^{th}$ batch of program data may be cached into SRAM 804 to form a backup copy of N$^{th}$ batch of program data when (N−1)$^{th}$ batch of program data is being programmed into 3D NAND memory 808. The backup copy of N$^{th}$ batch of program data in SRAM 804 may be maintained until it is determined the programming of N$^{th}$ batch of program data into 3D NAND memory 808 is successful. In some embodiments, host 810 reads out N$^{th}$ batch of program data from SRAM 804 for further processing and/or storage, e.g., before N$^{th}$ batch of program data is deleted from SRAM 804. For example, host 810 can store the read-out N$^{th}$ batch of program data at another location. In some embodiments, host 810 deletes a copy of the N$^{th}$ batch of program data from the host after N$^{th}$ batch of program data is cached into SRAM 804. In some embodiments, 3D memory device 800 checks the status of (N−1)$^{th}$ batch of program data when N$^{th}$ batch of program data is being programmed into respective pages in 3D NAND memory 808. Meanwhile, 3D memory device 800 may cache an (N+1)$^{th}$ batch of program data in respective space in SRAM 804. In some embodiments, host 810 reads out program data from page buffer 806 for further processing.

In some embodiments, 3D memory device 800 sequentially repeats the operation 1004 for subsequent batches of program data. At operation 1006, 3D memory device 800 programs N$^{th}$ batch of program data into respective pages. At this operation, 3D memory device 800 also caches (N+1)$^{th}$ batch of program data in a respective space in SRAM 804 and check the status of (N−1)$^{th}$ batch of program data. At operation 1008, 3D memory device 800 programs (N+1)$^{th}$ batch of program data into respective pages. At this operation, 3D memory device 800 also caches (N+2)$^{th}$ batch of program data in a respective space in SRAM 804 and check the status of N$^{th}$ batch of program data.

In some embodiments, 3D memory device 800 may sequentially cache a plurality of batches of program data and program the cached program data into 3D NAND memory 808. For example, 3D memory device 800 may sequentially cache a backup copy of (N−2)$^{th}$ batch of program data, a backup copy of (N−1)$^{th}$ batch of program data, and a backup copy of N$^{th}$ batch of program data into SRAM 804. 3D memory device 800 may then sequentially program the backup copies of (N−2)$^{th}$ batch of program data, (N−1)$^{th}$ batch of program data, and N$^{th}$ batch of program data into respective pages of 3D NAND memory 808 through page buffer 806. In some embodiments, 3D memory device 800 checks the status of (N−2)$^{th}$ batch of program data after it has been programmed. If the programming was successful, 3D memory device 800 may delete the backup copy of (N−2)$^{th}$ batch of program data from SRAM 804; if the programming failed, 3D memory device 800 may re-program 3D NAND memory 808 (e.g., repeatedly if necessary) using the backup copy of (N−2)$^{th}$ batch of program data until the status is successful. SRAM 804 may then have space for caching next the next batch of program data (e.g., (N+1)$^{th}$ batch of program data). In some embodiments, host 810 deletes copies of (N−2)$^{th}$ batch of program data, (N−1)$^{th}$ batch of program data, and N$^{th}$ batch of program data after these batches of program data are cached in SRAM 804.

3D NAND memory 808 may include a multi-level cell (MLC) NAND memory device, in which a number of the plurality of pages corresponds to a number of bits stored in a memory cell. In some embodiments, 3D NAND memory 808 includes a triple-level cell (TLC) NAND memory device packed in a RAM-less application environment, such as an eMMC or a UFS. In an example, to cache three batches of program data for a TLC NAND memory device with 4 planes, SRAM 804 has at least 648 kB of storage space.

SRAM 804 may also be employed as an on-die data buffer of 3D memory device 800. FIG. 9B illustrates system 930 in which SRAM 804 functions as an on-die data buffer. For ease of depiction, I/O 802 is omitted in FIG. 9B. In some embodiments, program data is programmed into 3D NAND memory 808 in pages, and SRAM 804 is illustrated as a plurality of data buffer units 914 (i.e., 914-1, . . . , 914-L), each being configured to buffer program data for programming a page in 3D NAND memory 808. 3D NAND memory 808 may be depicted as a plurality of planes 908 (i.e., 908-1, . . . , 908-M). M and L may each be a positive integer and may or may not be the same as each other. In operation, the plurality of data buffer units 914 can provide storage space to buffer program data before it is transmitted into page buffer 806. This allows program data stored in host 810 and to be programmed into 3D NAND memory 808 to be stored on the same chip as 3D memory device 800, releasing the main cache/buffer in host 810 for storing this program data. SRAM 804 may also reduce bandwidth in data buses (e.g., between 3D memory device 800 and host 810) for transmitting this program data during a programming operation. Instead, data transmission and processing can be performed in 3D memory device 800. Resources in host 810 that are used to store, process, and transmit the program data can be used for other purposes/operations. As shown in FIG. 9B, 3D memory device 800 receives program data corresponding to different word lines from host 810. The program data corresponding to word lines is depicted as WL0, . . . , WLP. The program data can be transmitted from host 810 to SRAM 804 sequentially, in groups, or in an arbitrary pattern, before it is buffered into page buffer 806. The depiction of program data WL0, . . . , WLP in 9B in each data buffer unit 914 is merely for illustrating the program data for programming a page and does not indicate sequentially operation of program data.

Referring to FIG. 11, method 1100 starts at operation 1102, in which 3D memory device 800 receives control instructions, from host 810, to condition 3D memory device 800 for a first pass program and a second pass program on memory cells of a page in 3D NAND memory 808. In some embodiments, 3D memory device 800 follows the control instructions to initialize SRAM cells of SRAM 804, e.g., erase data in/empty SRAM cells so SRAM 804 is ready to receive program data.

At operation 1104, 3D memory device 800 buffers first program data for the first pass program and second program data for the second pass program in SRAM 804. In some embodiments, a word line corresponds to its respective program data that includes the first program data and the second program data for programming the memory cells formed by the word line and intersecting memory strings. That is, for example, WL0 refers to first program data and second program data for programming memory cells formed by WL0 (i.e., word line 0 and intersecting memory cells). In some embodiments, the amount of program data buffered in SRAM 804 is determined based on the storage capacity of SRAM 804. Thus, program data corresponding to WL0, . . . , WLP may represent a portion or the entirety of the program data to be programmed in 3D NAND memory 808. In some embodiments, the first pass program is a coarse program, and the second pass program is a fine program.

The first program data and the second program data for programming memory cells formed by one or more word lines can be buffered into SRAM 804 at any suitable order before it is loaded in page buffer 806 for programming. For example, the first and second program data for programming memory cells formed by a first word line and a second word line can be buffered from host 810 at the same time (e.g., before performing the first pass program using the first program data), or be buffered separately (e.g., the second program data can be buffered after the first pass program is completed). In various embodiments of the present disclosure, the first and second program data is each buffered in SRAM 804 before it is transmitted into page buffer 806. In some embodiments, first and second program data for programming memory cells in all planes of 3D NAND memory 808 is buffered and stored SRAM 804 before being loaded into page buffer 806.

At operation 1106, 3D memory device 800 sequentially performs the first pass program using the first program data on memory cells formed by a first word line and a second word line. 3D memory device 800 may retrieve the buffered first program data from SRAM 804 and transmit it to page buffer 806 before it is programmed to respective memory cells in 3D NAND memory 808. The memory cells formed by or corresponding to a word line, as described in the present disclosure, refer to the memory cells formed by the word line and memory strings intersecting the word line. In some embodiments, the memory cells are programmed in pages, e.g., the first pass program may be performed on all memory cells formed by the memory strings and the first word line before it is performed on the memory cells formed by the memory strings and the second word line.

The memory cells being programmed may be MLCs. For example, each memory cell being programmed may be a quad-level cell (QLC) that has four threshold voltage states (e.g., lower page data (LP), middle page data (MP), upper page data (UP), and extra page data (XP)) for storing $2^4$ bits of data. The first program data and the second program data for programming each memory cell may be configured to program the memory cell to desired threshold voltage states. Table I illustrates an exemplary page map for QLCs in a page to be programmed. Table I illustrates the order the memory cells are programmed respectively in the first pass program and the second pass program. In TABLE I, string 0-string 5 refer to the six memory strings intersecting with the word lines, which are denoted using "WL #".

memory cells in each page formed by the memory strings and one word line is programmed, 3D memory device 800 proceeds to program the memory cells formed by the memory strings and the next word line. In this operation, the first pass program is sequentially performed on the memory cells formed by string0 to string5 with the first and second word lines (e.g., WL0 and WL1) according to the order provided in Table I.

At operation 1108, 3D memory device 800 retrieves the second program data from SRAM 804 and perform the second pass program on memory cells formed by the first word line using the second program data when the first pass program is completed. In some embodiments, when the first pass program, performed on the memory cells formed by the first and second word lines and all the memory strings (e.g., string0 to string5), is completed, 3D memory device 800 starts performing the second pass program automatically, e.g., without receiving permission from host 810. TABLE II illustrates an exemplary order memory cells in the page are programmed with a first pass program (e.g., a coarse program, shown as "1st" in Table II) and a second pass program (e.g., a fine program, shown as "2nd" in TABLE II).

TABLE II

|  | String0 | | String1 | | String2 | | String3 | | String4 | | String5 | |
| --- | --- | --- | --- | --- | --- | --- | --- | --- | --- | --- | --- | --- |
| WL# | 1st | 2nd | 1st | 2nd | 1st | 2nd | 1st | 2nd | 1st | 2nd | 1st | 2nd |
| 0 | 0  | 12 | 1  | 13 | 2  | 14 | 3  | 15 | 4  | 16 | 5  | 17 |
| 1 | 6  | 24 | 7  | 25 | 8  | 26 | 9  | 27 | 10 | 28 | 11 | 29 |
| 2 | 18 | 36 | 19 | 37 | 20 | 38 | 21 | 39 | 22 | 40 | 23 | 41 |
| 3 | 30 | 48 | 31 | 49 | 32 | 50 | 33 | 51 | 34 | 52 | 35 | 53 |

As shown in TABLE II, 3D memory device 800 may sequentially perform the first pass program on memory cells formed by string0 to string5 with the first and second word lines (e.g., WL0 and WL1, as described in Operation 1106) before sequentially performing the second pass program on memory cells formed by string0 to string5 with the first word line. In some embodiments, data (e.g., program data and/or control instructions) for performing first and second pass programs is transmitted in 3D memory device 800 without occupying data buses in host 810 and between host 810 and 3D memory device 800. In some embodiments, the order shown in Table II is predetermined before the first and the second pass programs are performed. 3D memory device 800 may repeat the operations described above for memory

TABLE I

|  | String0 | | | | String1 | | | | String2 | | | | String3 | | | | String4 | | | | String5 | | | |
| --- | --- | --- | --- | --- | --- | --- | --- | --- | --- | --- | --- | --- | --- | --- | --- | --- | --- | --- | --- | --- | --- | --- | --- | --- |
| WL# | LP | MP | UP | XP | LP | MP | UP | XP | LP | MP | UP | XP | LP | MP | UP | XP | LP | MP | UP | XP | LP | MP | UP | XP |
| 0 | 0  | 1  | 2  | 3  | 4  | 5  | 6  | 7  | 8  | 9  | 10 | 11 | 12 | 13 | 14 | 15 | 16 | 17 | 18 | 19 | 20 | 21 | 22 | 23 |
| 1 | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 |
| 2 | 48 | 49 | 50 | 51 | 52 | 53 | 54 | 55 | 56 | 57 | 58 | 59 | 60 | 61 | 62 | 63 | 64 | 65 | 66 | 67 | 68 | 69 | 70 | 71 |
| 3 | 72 | 73 | 74 | 75 | 76 | 77 | 78 | 79 | 80 | 81 | 82 | 83 | 84 | 85 | 86 | 87 | 88 | 89 | 90 | 91 | 92 | 93 | 94 | 95 |

In some embodiments, TABLE I shows an order a pass program (e.g., first or second pass program) is performed. For example, 3D memory device 800 can sequentially program the four threshold voltage states (i.e., LP, MP, UP, and XP) into each memory cell and sequentially program the memory cells formed by memory string 0 to memory string 5 and a word line (e.g., word line 0, 1, 2, or 3). After the cells formed by other word lines, e.g., memory cells corresponding to WL2 and WL3, until the programming of memory cells is completed.

3D NAND memory 808 may include a multi-level cell (MLC) NAND memory device, in which a number of the plurality of pages corresponds to a number of bits stored in a memory cell. In an example, to buffer first and second program data for memory cells formed by two word lines in a QLC NAND memory device with 4 planes, SRAM 804 has at least 3.4 MB of storage space.

In some embodiments, a 3D memory device includes a 3D NAND memory array having a plurality of pages, an on-die cache coupled to the memory array on a same chip and configured to cache a plurality of batches of program data between a host and the memory array, the on-die cache having SRAM cells, and a controller coupled to the on-die cache on the same chip. The controller is configured to check a status of an $(N-2)^{th}$ batch of program data, N being an integer equal to or greater than 2, program an $(N-1)^{th}$ batch of program data into respective pages in the 3D NAND memory array, and cache an $N^{th}$ batch of program data in respective space in the on-die cache as a backup copy of the $N^{th}$ batch of program data.

In some embodiments, the controller is configured to check a status of an $(N-2)^{th}$ batch of program data, program an $(N-1)^{th}$ batch of program data, and cache an $N^{th}$ batch of program data at the same time.

In some embodiments, in response to the status of the $(N-2)^{th}$ batch of program data being failed, the controller is further configured to retrieve a backup copy of the $(N-2)^{th}$ batch of program data from the on-die cache and program the backup copy of the $(N-2)^{th}$ batch of program data into respective pages in the 3D NAND memory array.

In some embodiments, the controller is further configured to read out the $N^{th}$ batch of program data from the on-die cache and send the read-out $N^{th}$ batch of program data to the host.

In some embodiments, the controller is further configured to cache the $(N-1)^{th}$ batch of program data from the host into the on-die cache as a backup copy of the $(N-1)^{th}$ batch of program data when the $(N-2)^{th}$ batch of program data is being programmed into respective pages in the 3D NAND memory array.

In some embodiments, the controller is further configured to check a status of the $(N-1)^{th}$ batch of program data, program the $N^{th}$ batch of program data into respective pages in the 3D NAND memory array, and cache an $(N+1)^{th}$ batch of program data in respective space in the on-die cache.

In some embodiments, to program a respective batch of program data into respective pages in the 3D NAND memory array, the controller is configured to retrieve a buffered copy of the respective batch of program data from a respective page buffer, and program the buffered copy of the respective batch of program data into the respective pages in the 3D NAND memory array.

In some embodiments, the controller is further configured to buffer the respective batch of program data in the respective page buffer before the respective batch of program data is programmed into the respective pages.

In some embodiments, the controller is further configured to cache, sequentially, a backup copy of the $(N-2)^{th}$ batch of program data and a backup copy of the $(N-1)^{th}$ batch of program data in the on-die cache before a caching of the backup copy of the $N^{th}$ batch of program data, and program, sequentially, the backup copies of the $(N-2)^{th}$ batch of program data, the $(N-1)^{th}$ batch of program data, and the $N^{th}$ batch of program data into respective pages.

In some embodiments, the $(N-2)^{th}$ batch of program data, the $(N-1)^{th}$ batch of program data, and the $N^{th}$ batch of program data each includes program data for a plurality of pages in the memory array.

In some embodiments, the 3D memory device includes a multi-level cell (MLC) NAND memory device. A number of the plurality of pages may correspond to a number of bits stored in a memory cell.

In some embodiments, the controller is further configured to delete a copy of the $N^{th}$ batch of program data from the host after the $N^{th}$ batch of program data is cached in the on-die cache.

In some embodiments, the 3D memory device is packaged in at least one of an eMMC or a UFS.

In some embodiments, a system for performing a cache program operation on a 3D memory device includes a host, a storage unit having a plurality of pages of NAND memory cells and being coupled to the host, a caching unit coupled to and on a same chip with the storage unit, the caching unit configured to cache a plurality of batches of program data between the host and the storage unit, and a control unit coupled to the caching unit and the host. The control unit is configured to check a status of an $(N-2)^{th}$ batch of program data that was programmed into the storage unit from the host. N is an integer equal to or greater than 2. The control unit is also configured to program an $(N-1)^{th}$ batch of program data into respective pages of the storage unit and cache an $N^{th}$ batch of program data in respective space in the caching unit as a backup copy of the $N^{th}$ batch of program data.

In some embodiments, the caching unit includes on-die SRAM cells.

In some embodiments, the control unit is configured to check a status of an $(N-2)^{th}$ batch of program data, program an $(N-1)^{th}$ batch of program data, and cache an $N^{th}$ batch of program data at the same time.

In some embodiments, in response to the status of the $(N-2)^{th}$ batch of program data being failed, the control unit is further configured to retrieve a backup copy of the $(N-2)^{th}$ batch of program data from the caching unit and program the backup copy of the $(N-2)^{th}$ batch of program data into respective pages of the storage unit.

In some embodiments, the control unit is further configured to read out the $N^{th}$ batch of program data from the caching unit and send the read-out $N^{th}$ batch of program data to the host.

In some embodiments, the control unit is further configured to cache the $(N-1)^{th}$ batch of program data from the host into the caching unit as a backup copy of the $(N-1)^{th}$ batch of program data when the $(N-2)^{th}$ batch of program data is being programmed into respective pages of the storage unit.

In some embodiments, the control unit is further configured to check a status of the $(N-1)^{th}$ batch of program data, program the $N^{th}$ batch of program data into respective pages of the storage unit, and cache an $(N+1)^{th}$ batch of program data in respective space in the caching unit.

In some embodiments, to program a respective batch of program data into respective pages of the storage unit, the control unit is configured to retrieve a buffered copy of the respective batch of program data from a respective buffer unit coupled to the storage unit and program the buffered copy of the respective batch of program data into the respective pages of the storage unit.

In some embodiments, the control unit is further configured to buffer the respective batch of program data in the respective buffer unit before the respective batch of program data is programmed into the respective pages.

In some embodiments, the control unit is further configured to cache, sequentially from the host, a backup copy of the $(N-2)^{th}$ batch of program data and a backup copy of the $(N-1)^{th}$ batch of program data in the caching unit before a caching of the backup copy of the $N^{th}$ batch of program data, and program, sequentially from the caching unit, the backup copies of the $(N-2)^{th}$ batch of program data, the $(N-1)^{th}$ batch of program data, and the $N^{th}$ batch of program data into respective pages.

In some embodiments, the $(N-2)^{th}$ batch of program data, the $(N-1)^{th}$ batch of program data, and the $N^{th}$ batch of program data each includes program data for a plurality of pages.

In some embodiments, the storage unit includes a multi-level cell (MLC) NAND memory device and a number of the plurality of pages corresponds to a number of bits stored in a memory cell.

In some embodiments, the control unit is further configured to delete a copy of the $N^{th}$ batch of program data from the host after the $N^{th}$ batch of program data is cached in the caching unit.

In some embodiments, a method for performing a cache program operation on a 3D memory device includes checking a status of an $(N-2)^{th}$ batch of program data that was programmed into the storage unit from the host. N is an integer equal to or greater than 2. The method may also include programming an $(N-1)^{th}$ batch of program data into respective pages in the 3D NAND memory array and caching an $N^{th}$ batch of program data in respective space in on-die static random-access memory (SRAM) cells as a backup copy of the $N^{th}$ batch of program data.

In some embodiments, checking a status of an $(N-2)^{th}$ batch of program data, programming the $(N-1)^{th}$ batch of program data, and caching an $N^{th}$ batch of program data are performed at the same time.

In some embodiments, in response to the status of the $(N-2)^{th}$ batch of program data being failed, the method further includes retrieving a backup copy of the $(N-2)^{th}$ batch of program data from the on-die SRAM cells and programming the backup copy of the $(N-2)^{th}$ batch of program data into respective pages in the 3D NAND memory array.

In some embodiments, the method further includes reading out the $N^{th}$ batch of program data from the on-die SRAM cells and sending the read-out $N^{th}$ batch of program data to the host.

In some embodiments, the method further includes caching the $(N-1)^{th}$ batch of program data from the host into the on-die SRAM cells as a backup copy of the $(N-1)^{th}$ batch of program data when the $(N-2)^{th}$ batch of program data is being programmed into respective pages in the 3D NAND memory array.

In some embodiments, the method further includes checking a status of the $(N-1)^{th}$ batch of program data, programming the $N^{th}$ batch of program data into respective pages in the 3D NAND memory array, and caching an $(N+1)^{th}$ batch of program data in respective space in the on-die SRAM cells.

In some embodiments, programming a respective batch of program data into respective pages in the 3D NAND memory array includes retrieving a buffered copy of the respective batch of program data from a respective page buffer and programming the buffered copy of the respective batch of program data into the respective pages in the 3D NAND memory array.

In some embodiments, the method further includes buffering the respective batch of program data in the respective page buffer before the respective batch of program data is programmed into the respective pages.

In some embodiments, the method further includes caching, sequentially from the host, a backup copy of the $(N-2)^{th}$ batch of program data and a backup copy of the $(N-1)^{th}$ batch of program data in the on-die SRAM cells before a caching of the backup copy of the $N^{th}$ batch of program data, and programming, sequentially from the on-die SRAM cells, the backup copies of the $(N-2)^{th}$ batch of program data, the $(N-1)^{th}$ batch of program data, and the $N^{th}$ batch of program data into respective pages.

In some embodiments, the $(N-2)^{th}$ batch of program data, the $(N-1)^{th}$ batch of program data, and the $N^{th}$ batch of program data each includes program data for a plurality of pages.

In some embodiments, the 3D memory device is a MLC NAND memory device and a number of the plurality of pages corresponds to a number of bits stored in a memory cell.

In some embodiments, the method further includes deleting a copy of the $N^{th}$ batch of program data from the host after the $N^{th}$ batch of program data is cached in the on-die SRAM cells.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a 3D NAND memory array;
an on-die static random-access memory (SRAM); and
peripheral circuits coupled to the 3D NAND memory array and formed on a same chip with the on-die SRAM, comprising:
  a page buffer coupled to the on-die SRAM; and
  a controller coupled to the on-die SRAM and the page buffer, and configured to:
    load program data into the page buffer and cache the program data into the on-die SRAM as a backup copy of the program data; and in response to a status of programming the program data from the page buffer into the 3D NAND memory array being failed, transmit the backup copy of the program data in the on-die SRAM to the page buffer, and program the backup copy of the program data in the page buffer into the 3D NAND memory array, wherein:

an $(N-2)^{th}$ batch of program data, an $(N-1)^{th}$ batch of program data, and an $N^{th}$ batch of program data are programmed into the 3D NAND memory array in this order, N being an integer equal to or greater than 2; and during programming the $(N-1)^{th}$ batch of program data into the 3D NAND memory array, the controller is configured to cache the $N^{th}$ batch of program data into the on-die SRAM, as a backup copy of the $N^{th}$ batch of program data, together with a backup copy of the $(N-2)^{th}$ batch of program data and a backup copy of the $(N-1)^{th}$ batch of program data in the on-die SRAM.

2. The 3D memory device of claim 1, wherein the controller is further configured to:
during loading the program data into the page buffer, cache the same program data into the on-die SRAM as the backup copy of the program data.

3. The 3D memory device of claim 1, wherein:
a first semiconductor structure comprises the peripheral circuits and the on-die SRAM;
a second semiconductor structure comprises the 3D NAND memory array; and
the first semiconductor structure and the second semiconductor structure are bonded through a bonding interface.

4. The 3D memory device of claim 1, further comprising a device layer that comprises a plurality of transistors, wherein:
the page buffer comprises a first portion of the plurality of transistors; and
the on-die SRAM comprises a second portion of the plurality of transistors.

5. The 3D memory device of claim 1, wherein the controller is configured to:
program a first program data configured for a first pass program and a second program data configured for a second pass program into the 3D NAND memory array.

6. The 3D memory device of claim 5, wherein the controller is configured to:
program the first program data and the second program data into the 3D NAND memory array sequentially.

7. The 3D memory device of claim 1, wherein:
the on-die SRAM is configured to simultaneously cache a plurality of batches of program data, comprising an $(N-2)^{th}$ batch of program data and an $(N-1)^{th}$ batch of program data, N being an integer equal to or greater than 2, the $(N-2)^{th}$ batch of program data being cached in the on-die SRAM as a backup copy of the $(N-2)^{th}$ batch of program data, and the $(N-2)^{th}$ batch of program data and the $(N-1)^{th}$ batch of program data being programmed into the 3D NAND memory array sequentially; and the controller is configured to:
check a status of programming the $(N-2)^{th}$ batch of program data into the 3D NAND memory array; and
in response to the status of programming the $(N-2)^{th}$ batch of program data being failed, program the $(N-2)^{th}$ batch of program data into the 3D NAND memory array based on the backup copy of the $(N-2)^{th}$ batch of program data in the on-die SRAM.

8. The 3D memory device of claim 7, wherein the controller is configured to:
in response to the status of programming the $(N-2)^{th}$ batch of program data being successful, delete the backup copy of the $(N-2)^{th}$ batch of program data in the on-die SRAM.

9. The 3D memory device of claim 1, wherein:
during programming the $(N-1)^{th}$ batch of program data into the 3D NAND memory array, the controller is configured to check a status of programming the $(N-2)^{th}$ batch of program data into the 3D NAND memory array; and
in response to the status of programming the $(N-2)^{th}$ batch of program data being failed, transmit the backup copy of the $(N-2)^{th}$ batch of program data in the on-die SRAM to the page buffer and program the backup copy of the $(N-2)^{th}$ batch of program data in the page buffer into the 3D NAND memory array.

10. The 3D memory device of claim 1, wherein:
the 3D NAND memory array comprises a plurality of pages; and
the on-die SRAM comprises a plurality of cache units each corresponding to one of the plurality of pages, each of the plurality of cache units being configured to cache a portion of the program data for programming one page of the plurality of pages in the 3D NAND memory array.

11. The 3D memory device of claim 10, wherein:
a same batch of program data is cached in the plurality of cache units simultaneously; and
the controller is configured to load the same batch of program data, from each of the plurality of cache units, into the page buffer at a same time.

12. The 3D memory device of claim 1, wherein:
a host is coupled to the 3D memory device and configured to sequentially transmit a plurality of batches of program data to the page buffer; and
the controller is configured to:
load the plurality of batches of program data sequentially into the page buffer as buffered copies of the batches of program data; and
sequentially program the plurality of batches of program data into the 3D NAND memory array based on the buffered copies of the batches of program data.

13. The 3D memory device of claim 12, wherein:
the on-die SRAM is arranged between the host and the page buffer; and
the controller is configured to:
cache the plurality of batches of program data sequentially into the on-die SRAM as backup copies of the batches of program data; and
in response to determining that programming one batch of the batches of program data based on a corresponding buffered copy of the batch of program data is unsuccessful, program the batch of program data into the 3D NAND memory array based on a corresponding backup copy of the batch of program data.

14. The 3D memory device of claim 1, wherein:
an $(N-2)^{th}$ batch of program data, an $(N-1)^{th}$ batch of program data, and an $N^{th}$ batch of program data are programmed into the 3D NAND memory array in this order, N being an integer equal to or greater than 2; and
the controller is configured to, in a parallel manner, perform:
checking a status of programming the $(N-2)^{th}$ batch of program data into the 3D NAND memory array;

programming the (N−1)$^{th}$ batch of program data into the 3D NAND memory array; and caching the N$^{th}$ batch of program data into the on-die SRAM as a backup copy of the N$^{th}$ batch of program data, together with a backup copy of the (N−2)$^{th}$ batch of program data and a backup copy of the (N−1)$^{th}$ batch of program data in the on-die SRAM.

15. The 3D memory device of claim 14, wherein:

in response to the status of programming the (N−2)$^{th}$ batch of program data based on a buffered copy of the (N−2)$^{th}$ batch of program data being failed, the controller is configured to program the (N−2)$^{th}$ batch of program data based on the backup copy of the (N−2)$^{th}$ batch of program data.

16. The 3D memory device of claim 14, wherein:

in response to the status of programming the (N−2)$^{th}$ batch of program data being successful, the controller is configured to delete the backup copy of the (N−2)$^{th}$ batch of program data in the on-die SRAM.

17. The 3D memory device of claim 1, wherein the controller is configured to:

obtain the program data from a host and transmit the program data to the page buffer and the on-die SRAM, respectively.

18. A three-dimensional (3D) memory device, comprising:

a first semiconductor structure comprising a 3D NAND memory array;

a second semiconductor structure comprising peripheral circuits and an on-die static random-access memory (SRAM), the first semiconductor structure and the second semiconductor structure being bonded through a bonding interface to couple the 3D NAND memory array with the peripheral circuits and the on-die SRAM, wherein the peripheral circuits comprise:

a page buffer coupled to the on-die SRAM; and a controller coupled to the on-die SRAM and the page buffer, and configured to:

load a first batch of program data into the page buffer and cache the first batch of program data into the on-die SRAM, as a backup copy of the first batch of program data, together with a backup copy of a second batch of program data in the on-die SRAM; and in response to a status of programming the first batch of program data from the page buffer into the 3D NAND memory array being failed, transmit the backup copy of the first batch of program data in the on-die SRAM to the page buffer and program the backup copy of the first batch of program data in the page buffer into the 3D NAND memory array, wherein the controller is further configured to check the status of programming the first batch of program data and program a third batch of program data into the 3D NAND memory array simultaneously, the first batch of program data and the third batch of program data being generated consecutively.

19. A memory system, comprising:

a host;

a memory device coupled to the host and comprising;

a three-dimensional (3D) NAND memory array;

an on-die static random-access memory (SRAM); and peripheral circuits coupled to the 3D NAND memory array and formed on a same chip with the on-die SRAM, comprising:

a page buffer coupled to the on-die SRAM and configured to sequentially receive a plurality of batches of program data from the host, the plurality of batches of program data being programmed into the 3D NAND memory array sequentially; and a controller coupled to the on-die SRAM and the page buffer, and configured to:

load one batch of the plurality of batches of program data into the page buffer and cache the batch of program data into the on-die SRAM as a backup copy of the batch of program data; and in response to a status of programming the batch of program data from the page buffer into the 3D NAND memory array being failed, transmit the backup copy of the batch of program data in the on-die SRAM to the page buffer, and program the backup copy of the batch of program data in the page buffer into the 3D NAND memory array, wherein the controller is further configured to program an M$^{th}$ batch of program data into the 3D NAND memory array, cache an (M+1)$^{th}$ batch of program data into the on-die SRAM, and check a status of programming an (M−1)$^{th}$ batch of program data simultaneously, M being an integer equal to or greater than 1.

20. The 3D memory device of claim 1, wherein the controller is further configured to program the (N−1)$^{th}$ batch of program data into the 3D NAND memory array, cache the N$^{th}$ batch of program data into the on-die SRAM, and check a status of programming the (N−2)$^{th}$ batch of program data simultaneously.

* * * * *